United States Patent [19]
Harada et al.

[11] Patent Number: 5,525,821
[45] Date of Patent: Jun. 11, 1996

[54] PN JUNCTION TRENCH ISOLATION TYPE SEMICONDUCTOR DEVICE

[75] Inventors: Masana Harada; Katsuhiro Tsukamoto, both of Itami, Japan

[73] Assignee: Mitsubishi Denki Kabushiki Kaisha, Tokyo, Japan

[21] Appl. No.: 383,672

[22] Filed: Feb. 1, 1995

Related U.S. Application Data

[63] Continuation of Ser. No. 92,682, Jul. 16, 1993, abandoned.

[30] Foreign Application Priority Data

Jul. 21, 1992 [JP] Japan ................................. 4-193986

[51] Int. Cl.⁶ ................................................... H01L 29/10
[52] U.S. Cl. .......................... 257/331; 257/332; 257/333; 257/334; 257/339
[58] Field of Search ........................... 257/328–334, 257/339

[56] References Cited

U.S. PATENT DOCUMENTS

| | | | |
|---|---|---|---|
| 4,791,462 | 12/1988 | Blanchard et al. | 257/331 |
| 5,003,372 | 3/1991 | Kim et al. | 257/330 |
| 5,072,266 | 12/1991 | Bulucea et al. | 257/331 |
| 5,184,204 | 2/1993 | Mihara et al. | 257/629 |

FOREIGN PATENT DOCUMENTS

| | | | |
|---|---|---|---|
| 0159663 | 10/1985 | European Pat. Off. | 257/330 |
| 59-155270 | 9/1984 | Japan | 257/339 |

OTHER PUBLICATIONS

"Time MOS Depletion–Mode Thyristor: A New MOS–Controlled Bipolar Power Device" Baliga, et al., *IEEE Electron Device Letters*, vol. 9, No. 8, Aug. 1988, pp. 411–413.

*Solid–State Electronics*, vol. 33, No. 11, pp. 1459–1466, 1990, J. Akhtar, et al., "Study of Avalanche Multiplication in Planar–Terminated Junctions", pp. 1459–1466.

*IEEE Transactions on Electron Devices*, vol. 36, No. 9, Sep. 1989, H. R. Chang, et al., "500–V n–Channel Insulated–Gate Bipolar Transistor with a Trench Gate Structure", pp. 1824–1829.

*Primary Examiner*—J. Carroll
*Attorney, Agent, or Firm*—Oblon, Spivak, McClelland, Maier & Neustadt

[57] ABSTRACT

There is disclosed a semiconductor device including a plurality of P well regions (4) and a P well region (41) insulated from each other by a plurality of trench isolating layers (10) formed regularly in predetermined spaced relation with each other and having the same depth. The outermost P well region (41) isolatedly formed externally of an outermost trench isolating layer (10A) is made as deep as the trench isolating layers (10) and, accordingly, is made deeper than the P well regions (4) except the outermost P well region (41). This provides for the alleviation of the electric field concentration generated in the bottom edge of the outermost isolating layer of trench structure, thereby achieving the semiconductor device having an improved device breakdown voltage and a method of fabricating the same.

18 Claims, 31 Drawing Sheets

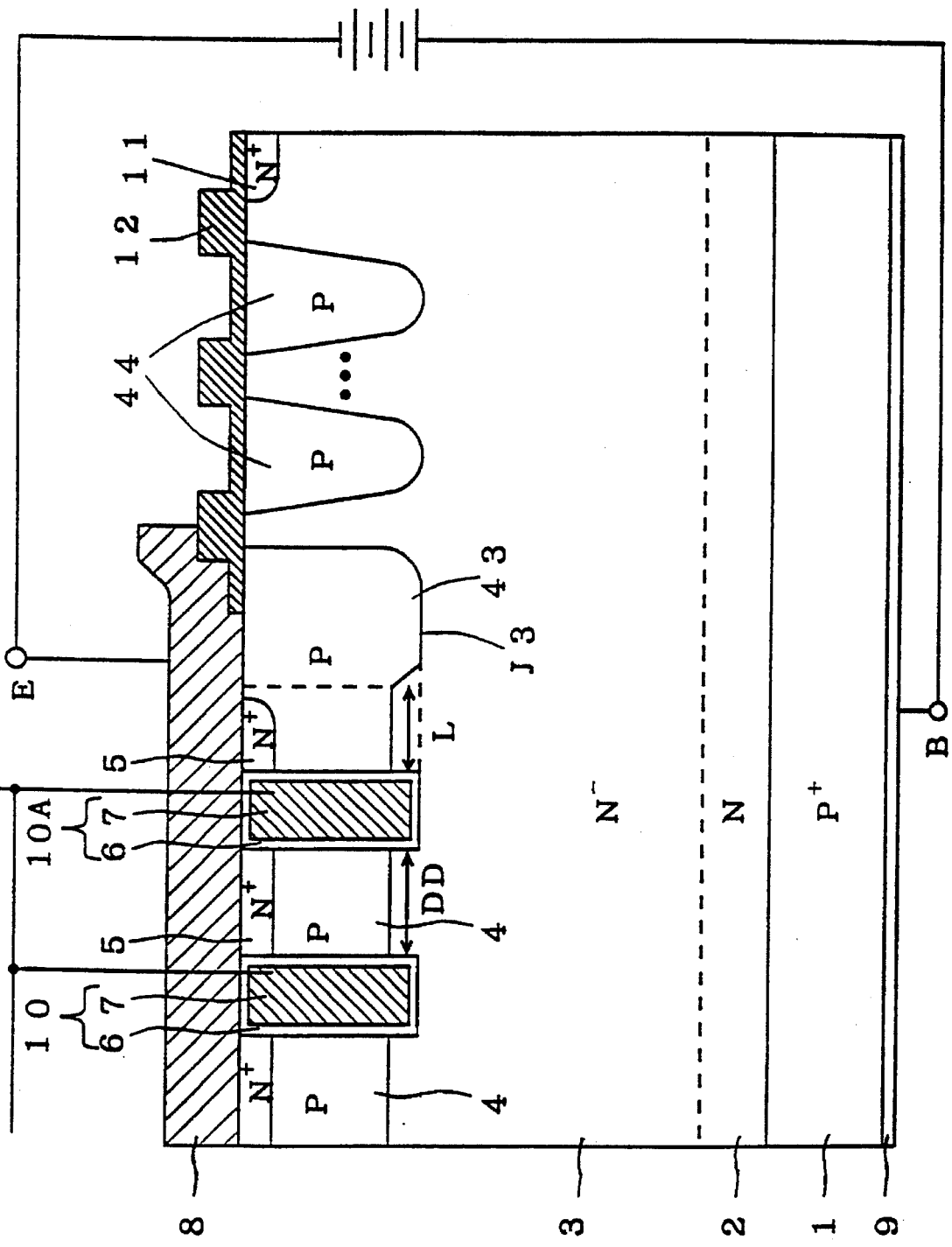

PN JUNCTION TRENCH ISOLATION TYPE SEMICONDUCTOR DEVICE

This application is a continuation of application Ser. No. 08/092,682, filed Jul. 16, 1993, now abandoned.

BACKGROUND OF THE INVENTION

1. Field of the Invention

The present invention relates to semiconductor devices including trenches formed through a PN junction and, more particularly, to a MOSFET, an IGBT and the like having trench MOS gates.

2. Description of the Background Art

FIG. 25 is a cross-sectional view of a conventional IGBT of trench MOS structure. As shown in FIG. 25, an N epitaxial layer 2 is formed on a $P^+$ substrate 1, and an $N^-$ epitaxial layer 3 is formed on the N epitaxial layer 2. On the $N^-$ epitaxial layer 3, a plurality of P well regions 4 are formed which are insulated from each other by trench isolating layers 10 each including gate polysilicon 7 and an oxide film 6 therearound. An $N^+$ emitter region 5 is formed in the surface of each P well region 4. An emitter electrode 8 is formed over the P well regions 4, the $N^+$ emitter regions 5 and the trench isolating layers 10. A collector electrode 9 is formed on the lower surface of the $P^+$ substrate 1.

In the IGBT having such arrangement, when a driving voltage of not less than a threshold voltage is applied to the gate polysilicon 7, with the emitter electrode 8 grounded and a predetermined positive voltage applied to the collector electrode 9 as shown in FIG. 26, channels are formed in the P well regions 4 along the side walls of the gate polysilicon 7. Current flows through the channels, so that the IGBT turns on.

When the driving voltage applied to the gate polysilicon 7 is not more than the threshold voltage, the channels disappear, so that the IGBT turns off. In the off state, a collector voltage is maintained by a depletion layer extending toward the $N^-$ epitaxial layer 3 from a PN junction J biased in the reverse direction at the interface of the P well regions 4 and the $N^-$ epitaxial layer 3.

The conventional IGBT of trench MOS structure has the above-mentioned arrangement. An outermost P well region 4A insulatedly formed on the outside of the outermost of the plurality of trench isolating layers 10 for insulating the P well regions 4 is as deep as the other P well regions 4.

This causes the greatest electric field concentration in a bottom edge adjacent region R1 of the outermost trench isolating layer 10 which lies in the depletion layer extending from the PN junction J maintaining the collector voltage, as shown in FIG. 26, when the IGBT is off.

FIG. 27 shows a potential distribution (F1) about the bottom edge of the outermost trench isolating layer and a potential distribution (F2) about the bottom edge of another trench isolating layer when the IGBT is off. FIG. 28 shows an electric field distribution (F3) about the bottom edge of the outermost trench isolating layer and an electric field distribution (F4) about the bottom edge of another trench isolating layer when the IGBT is off. It is apparent from FIGS. 27 and 28 that the electric field concentration generated about the bottom edge of the outermost trench isolating layer is much greater than that generated about the bottom edge of the other trench isolating layers.

The semiconductor device including the trench structure that separates the PN junction such as an IGBT of trench MOS structure presents a problem in that, since the electric field concentration about the bottom edge of the outermost trench structure is much greater than that of the other regions when the PN junction is biased in the reverse direction, a device breakdown voltage is lowered which is the breakdown voltage at the PN junction of the semiconductor device.

SUMMARY OF THE INVENTION

According to the present invention, a semiconductor device comprises: a first semiconductor layer of a first conductivity type having first and second major surfaces; a second semiconductor layer of a second conductivity type formed on the first major surface of the first semiconductor layer; and a plurality of spaced isolating layers each selectively formed through the second semiconductor layer and having the same depth, the plurality of isolating layers separating the second semiconductor layer into a plurality of divided semiconductor regions insulated from each other, the plurality of divided semiconductor regions including an outermost divided semiconductor region located outermost thereof, the outermost divided semiconductor region being deeper than the other divided semiconductor regions.

In accordance with the semiconductor device of the present invention, the outermost divided semiconductor region located outermost of the plurality of divided semiconductor regions is deeper than the other divided semiconductor regions.

The position of the PN junction formed at the interface between the outermost divided semiconductor region and the first semiconductor layer is closer to the deepest portion of the isolating layers than the position of the PN junction formed at the interface between the other divided semiconductor regions and the first semiconductor layer or is deeper than the deepest portion of the isolating layers. When the PN junction at the interface between the first semiconductor layer and the divided semiconductor regions is biased in the reverse direction, the electric field concentration is alleviated which is generated about the bottom edge of the outermost isolating layer adjacent the outermost divided semiconductor region.

As a result, a device breakdown voltage is improved which is the breakdown voltage of the PN junction formed at the interface of the first semiconductor layer and the divided semiconductor regions of the semiconductor device in which the electric field concentration is alleviated.

In another aspect of the present invention, a semiconductor device comprises: a first semiconductor layer of a first conductivity type having first and second major surfaces; a second semiconductor layer of a second conductivity type formed on the first major surface of the first semiconductor layer; and a plurality of spaced isolating layers having the same depth and including a predetermined outermost isolating layer, the isolating layers being selectively formed such that the predetermined outermost isolating layer does not extend through the second semiconductor layer and the other isolating layers extend through the second semiconductor layer, the plurality of isolating layers except the predetermined outermost isolating layer separating the second semiconductor layer into a plurality of divided semiconductor regions insulated from each other, the plurality of divided semiconductor regions including an outermost divided semiconductor region located outermost thereof, the outermost divided semiconductor region having a depth which does not permit the predetermined outermost isolating layer provided therein to extend therethrough.

In accordance with the semiconductor device of the present invention, the outermost semiconductor region located outermost of the plurality of divided semiconductor regions is formed so as to completely cover the predetermined outermost isolating layer. Thus when the PN junction at the interface between the first semiconductor layer and the divided semiconductor regions is biased in the reverse direction, no electric field concentration is generated in the predetermined isolating layer covered with the outermost divided semiconductor region.

As a result, the device breakdown voltage is improved which is the breakdown voltage of the PN junction formed at the interface between the first semiconductor layer and the divided semiconductor regions of the semiconductor device.

In still another aspect of the present invention, a semiconductor device comprises: a first semiconductor layer of a first conductivity type having first and second major surfaces; a second semiconductor layer of a second conductivity type formed on the first major surface of the first semiconductor layer; and a plurality of spaced isolating layers each selectively formed through the second semiconductor layer and having the same depth, the plurality of isolating layers being spaced a first distance apart from each other and separating the second semiconductor layer into a plurality of divided semiconductor regions insulated from each other, the plurality of divided semiconductor regions including an outermost divided semiconductor region located outermost thereof, the plurality of isolating layers including an outermost isolating layer adjacent to the outermost divided semiconductor region, the outermost divided semiconductor region including a first region extending outwardly from a position spaced a second distance apart from the outermost isolating layer, the second distance being shorter than the first distance, the first region of the outermost divided semiconductor region being deeper than the other divided semiconductor regions.

In accordance with the semiconductor device of the present invention, the outermost divided semiconductor region in the first region spaced the second distance, which is shorter than the first distance between adjacent isolating layers, apart from the outermost isolating layer adjacent thereto is deeper than the other divided semiconductor regions.

The position of the PN junction formed at the interface between the outermost divided semiconductor region in the first region and the first semiconductor layer is closer to the deepest portion of the isolating layers than the position of the PN junction formed at the interface between the other divided semiconductor regions and the first semiconductor layer or is deeper than the deepest portion of the isolating layers. When the PN junction at the interface between the first semiconductor layer and the divided semiconductor regions is biased in the reverse direction, the electric field concentration is alleviated which is generated about the bottom edge of the outermost isolating layer adjacent the outermost divided semiconductor region. As a result, the device breakdown voltage is improved which is the breakdown voltage of the PN junction formed at the interface between the first semiconductor layer and the divided semiconductor regions of the semiconductor device.

The present invention is also intended for a method of fabricating a semiconductor device. According to the present invention, the method comprises the steps of: (a) providing a first semiconductor layer of a first conductivity type having first and second major surfaces; (b) forming a second semiconductor layer of a second conductivity type on the first major surface of the first semiconductor layer, the second semiconductor layer including a first internal partial region having a first depth and a second partial region external to the first partial region having a second depth, the second depth being more than the first depth; and (c) selectively forming a plurality of spaced isolating layers through the second semiconductor layer, the plurality of isolating layers having the same depth and separating the second semiconductor layer into a plurality of divided semiconductor regions insulated from each other, the plurality of divided semiconductor regions including an outermost divided semiconductor region located outermost thereof, the depth of the outermost divided semiconductor region being set to the second depth, the depth of the other divided semiconductor regions being set to the first depth.

In accordance with a semiconductor device fabricated by the method of the present invention, the outermost divided semiconductor region located outermost of the plurality of divided semiconductor regions is deeper than the other divided semiconductor regions.

The position of the PN junction formed at the interface between the outermost divided semiconductor region and the first semiconductor layer is closer to the deepest portion of the isolating layers than the position of the PN junction formed at the interface between the other divided semiconductor regions and the first semiconductor layer or is deeper than the deepest portion of the isolating layers. When the PN junction at the interface between the first semiconductor layer and the divided semiconductor regions is biased in the reverse direction, the electric field concentration is alleviated which is generated about the bottom edge of the outermost isolating layer adjacent the outermost divided semiconductor region.

As a result, a device breakdown voltage is improved which is the breakdown voltage of the PN junction formed at the interface of the first semiconductor layer and the divided semiconductor regions of the semiconductor device in which the electric field concentration is alleviated.

In another aspect of the present invention, a method of fabricating a semiconductor device comprises the steps of: providing a first semiconductor layer of a first conductivity type having first and second major surfaces; forming a second semiconductor layer of a second conductivity type on the first major surface of the first semiconductor layer, the second semiconductor layer including a first internal partial region having a first depth and a second partial region external to the first partial region having a second depth, the second depth being more than the first depth; and selectively forming a plurality of spaced isolating layers having the same depth such that some of the isolating layers extend through the first partial region of the second semiconductor layer and the others do not extend through the second partial region thereof, the isolating layers extending through the first partial region separating the second semiconductor layer into a plurality of divided semiconductor regions insulated from each other.

In accordance with a semiconductor device fabricated by the method of the present invention, the outermost semiconductor region located outermost of the plurality of divided semiconductor regions is formed so as to completely cover the predetermined outermost isolating layer. Thus when the PN junction at the interface between the first semiconductor layer and the divided semiconductor regions is biased in the reverse direction, no electric field concentration is generated in the predetermined isolating layer covered with the outermost divided semiconductor region.

As a result, the device breakdown voltage is improved which is the breakdown voltage of the PN junction formed at the interface between the first semiconductor layer and the divided semiconductor regions of the semiconductor device.

In still another aspect of the present invention, a method of fabricating a semiconductor device comprises the steps of: providing a first semiconductor layer of a first conductivity type having first and second major surfaces; forming a second semiconductor layer of a second conductivity type on the first major surface of the first semiconductor layer, the second semiconductor layer including a first internal partial region having a first depth and a second partial region external to the first partial region having a second depth, the second depth being more than the first depth; and selectively forming a plurality of spaced isolating layers of the same depth through the second semiconductor layer, the plurality of isolating layers being spaced a first distance apart from each other, the plurality of isolating layers separating the second semiconductor layer into a plurality of divided semiconductor regions insulated from each other, the plurality of divided semiconductor regions including an outermost divided semiconductor region located outermost thereof, the plurality of isolating layers including an outermost isolating layer adjacent to the outermost divided semiconductor region, the outermost divided semiconductor region including a first region extending outwardly from a position spaced a second distance apart from the outermost isolating layer and a second region extending inwardly therefrom, the second distance being shorter than the first distance, the first region of the outermost divided semiconductor region being of the second depth, the second region of the outermost divided semiconductor region being of the first depth.

In accordance with a semiconductor device fabricated by the method of the present invention, the outermost divided semiconductor region in the first region spaced the second distance, which is shorter than the first distance between adjacent isolating layers, apart from the outermost isolating layer adjacent thereto is deeper than the other divided semiconductor regions.

The position of the PN junction formed at the interface between the outermost divided semiconductor region in the first region and the first semiconductor layer is closer to the deepest portion of the isolating layers than the position of the PN junction formed at the interface between the other divided semiconductor regions and the first semiconductor layer or is deeper than the deepest portion of the isolating layers. When the PN junction at the interface between the first semiconductor layer and the divided semiconductor regions is biased in the reverse direction, the electric field concentration is alleviated which is generated about the bottom edge of the outermost isolating layer adjacent the outermost divided semiconductor region. As a result, the device breakdown voltage is improved which is the breakdown voltage of the PN junction formed at the interface between the first semiconductor layer and the divided semiconductor regions of the semiconductor device.

An object of the present invention is to provide a semiconductor device which is capable of alleviating electric field concentration about the bottom edge of the outermost one of a plurality of trench structures for isolating the PN junction to achieve an improvement in device breakdown voltage, and a method of fabricating the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a cross-sectional view of the IGBT of the third preferred embodiment according to the invention including the provision of guard ring regions.

DESCRIPTION OF THE PREFERRED EMBODIMENTS

Figure 1:
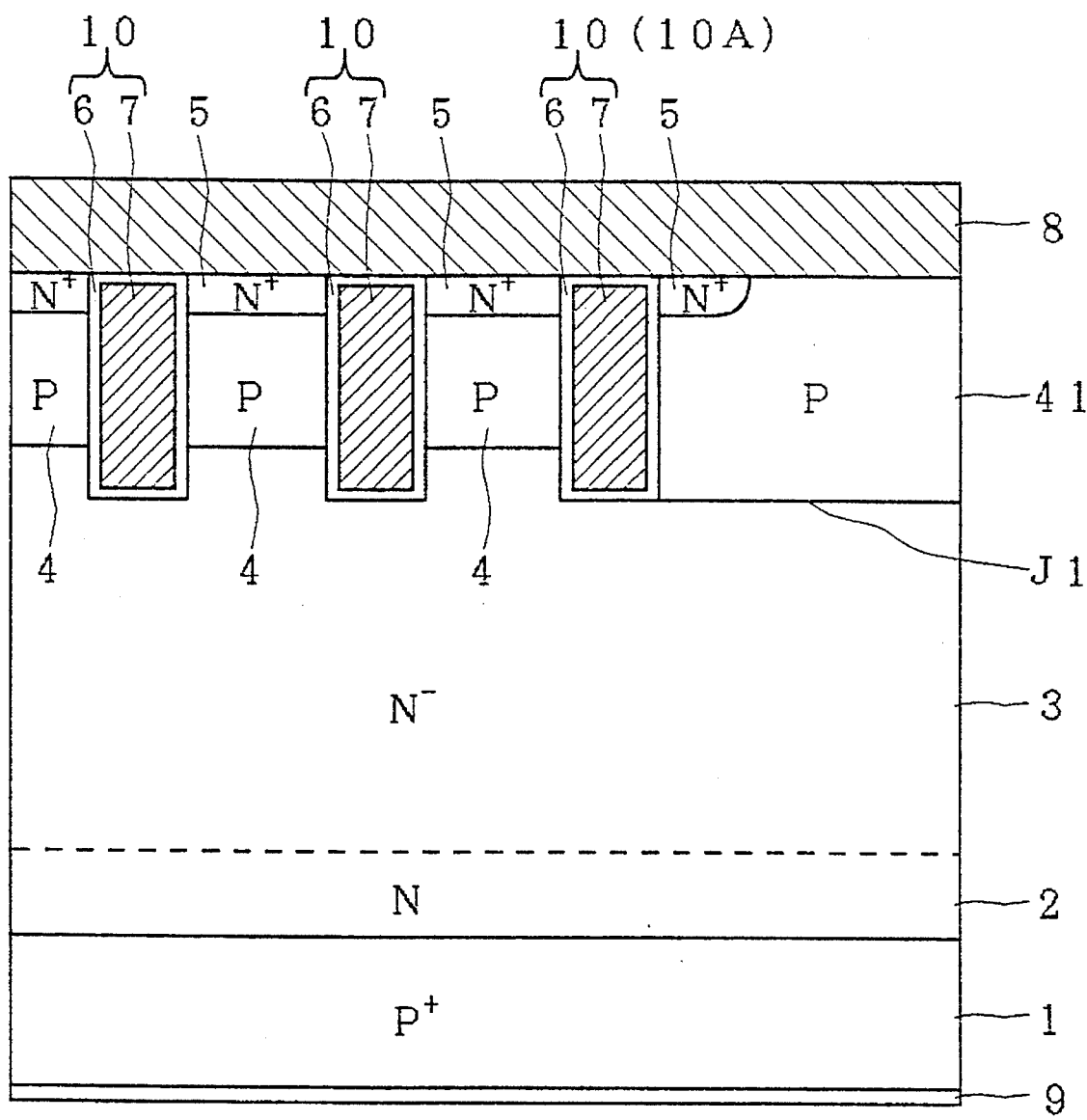
FIG. 1 is a cross-sectional view of a first mode of an IGBT of a first preferred embodiment according to the present invention.

FIG. 1 is a cross-sectional view of an IGBT of trench MOS gate structure of a first mode of a first preferred embodiment according to the present invention. Referring to FIG. 1, an N epitaxial layer 2 is formed on a $P^+$ substrate 1, and an N⁻ epitaxial layer 3 is formed on the N epitaxial layer 2. On the N⁻ epitaxial layer 3, a plurality of P well regions 4 and a P well region 41 are formed which are insulated from each other by a plurality of trench isolating layers 10 each including gate polysilicon 7 and an oxide film 6 therearound.

The trench isolating layers 10 are formed regularly in predetermined spaced relation with each other, and have the same depth. An N⁺ emitter region 5 is formed in the surface of each P well region 4, 41. An emitter electrode 8 is formed over the P well regions 4 and 41, the N⁺ emitter regions 5 and the trench isolating layers 10. A collector electrode 9 is formed on the lower surface of the P⁺ substrate 1.

The outermost P well region 41 adjacent the outermost trench isolating layer 10A is made as deep as the trench isolating layers 10, so that it is deeper than the P well regions 4.

Figure 2:
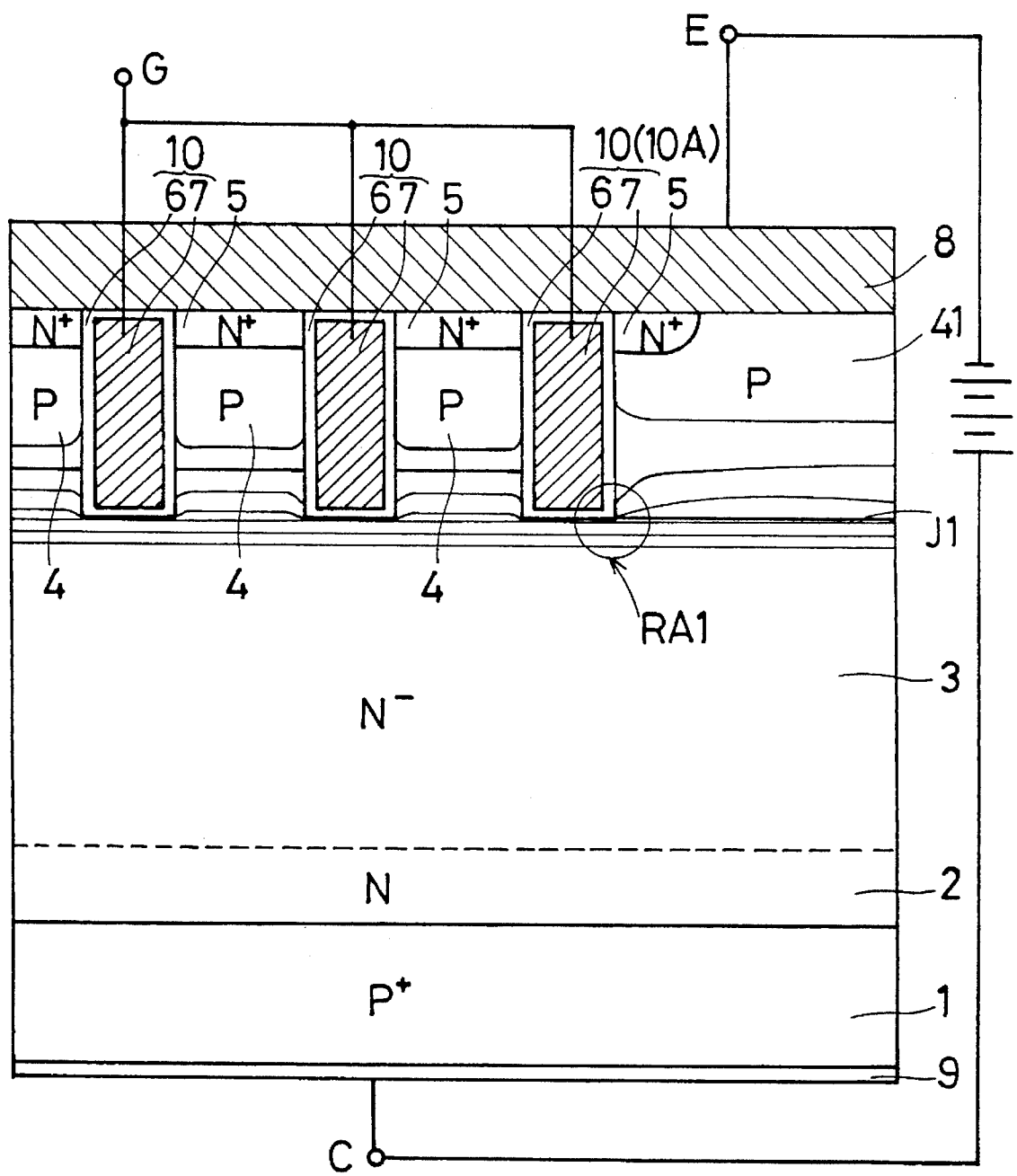
FIG. 2 illustrates a potential distribution of the first mode of the IGBT of the first preferred embodiment when it is off.

In the IGBT having such arrangement, when a driving voltage of not less than a threshold voltage is applied to the gate polysilicon 7, with the emitter electrode 8 grounded and a predetermined positive voltage applied to the collector electrode 9 as shown in FIG. 2, channels are formed in the P well regions 4 along the side walls of the gate polysilicon 7. Current flows through the channels, so that the IGBT turns on.

When the driving voltage applied to the gate polysilicon 7 is not more than the threshold voltage, with a power supply voltage applied across the emitter electrode 8 and the collector electrode 9 such that the collector electrode 9 is positive, the IGBT then turns off.

Figure 26:
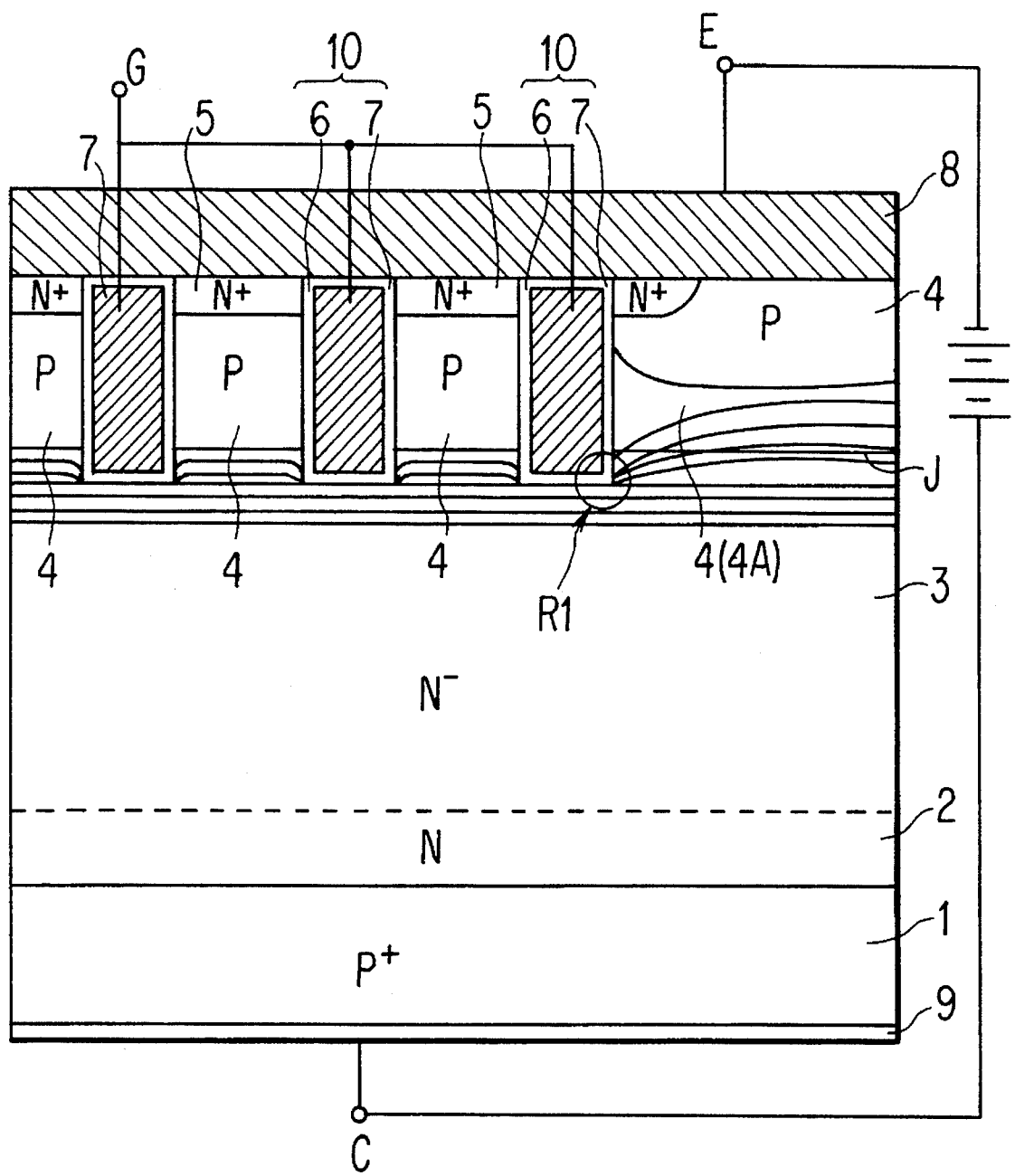
FIG. 26 illustrates a potential distribution of the conventional IGBT when it is off.
Figure 27:
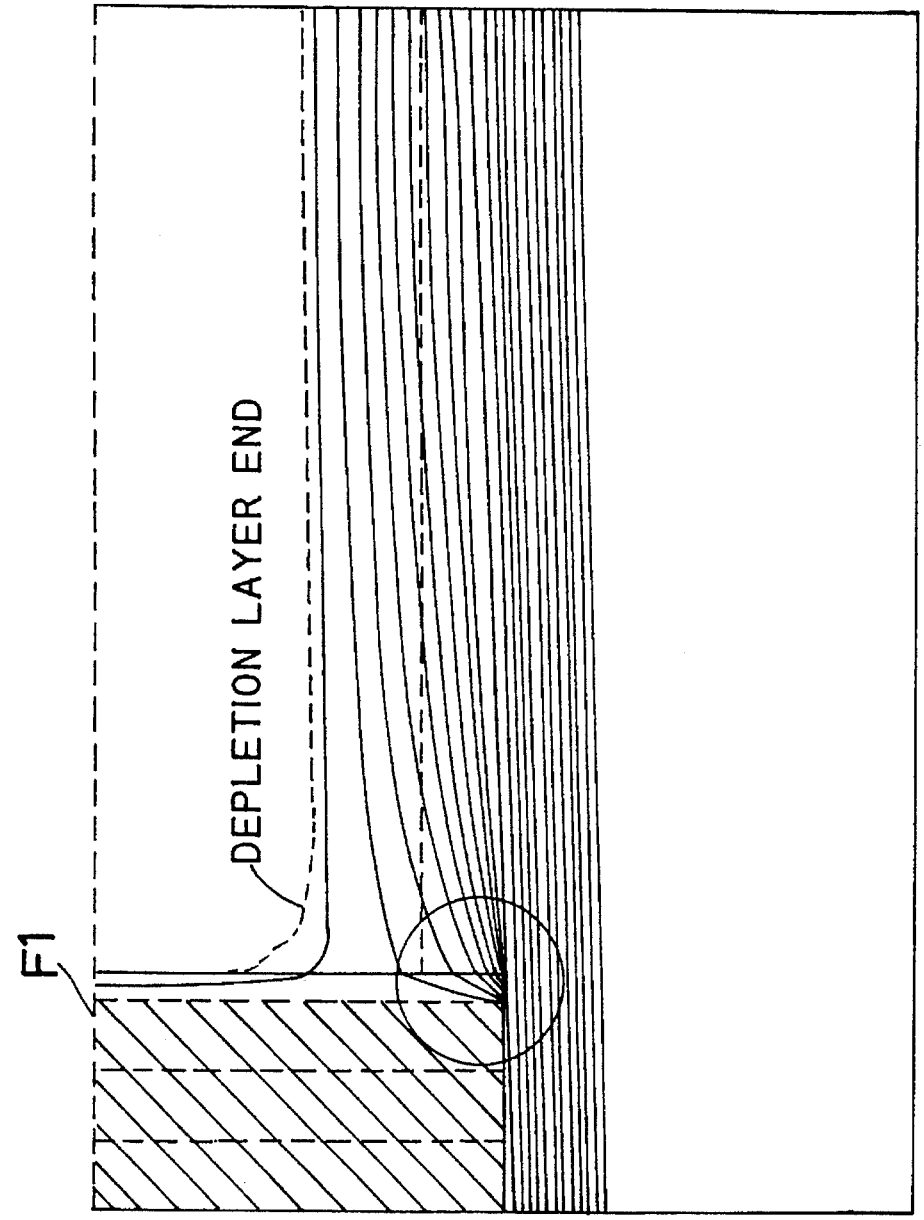
FIG. 27 is a graph showing a simulation result of the potential distribution of the conventional IGBT when it is off.
Figure 27:
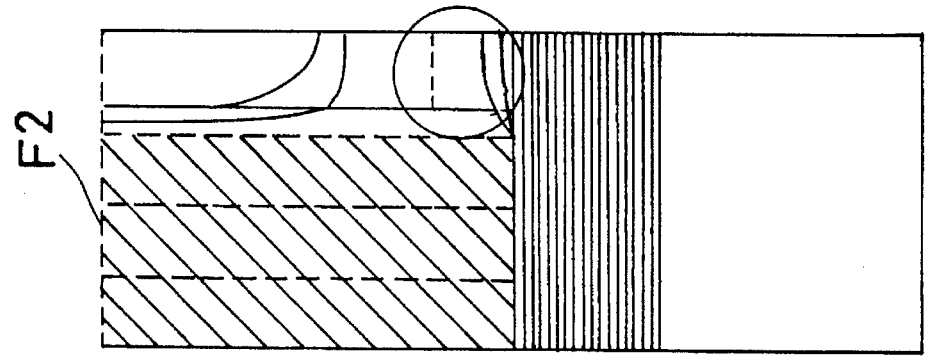
Figure 28:
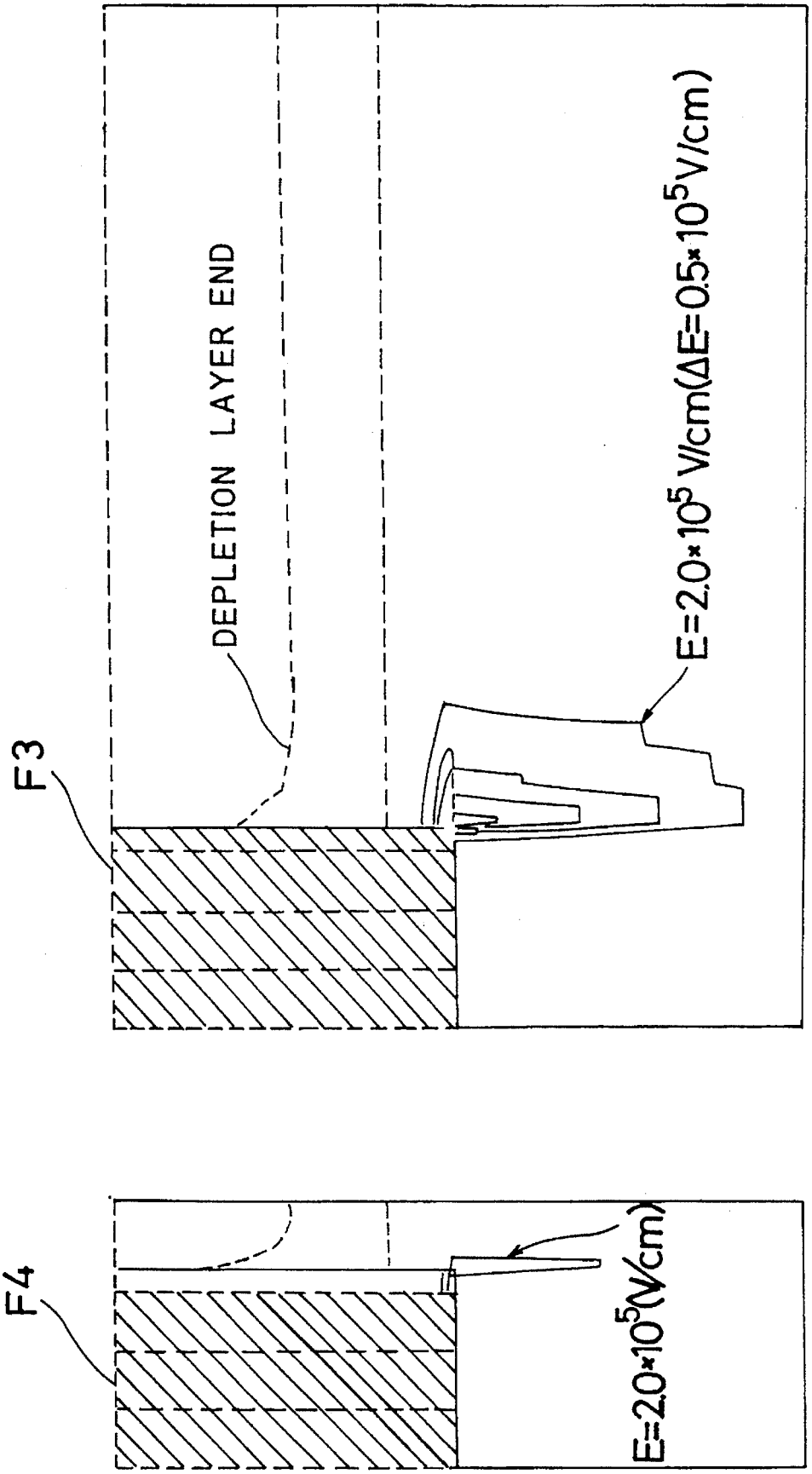
FIG. 28 is a graph showing a simulation result of an electric field distribution of the conventional IGBT when it is off.

When the IGBT is off, a great part of a depletion layer extends toward the N⁻ epitaxial layer 3 from a PN junction J1 biased in the reverse direction to maintain a collector voltage. A potential distribution at this time is shown in FIG. 2, in which the electric field concentration in a bottom edge adjacent region RA1 of the outermost trench isolating layer 10A becomes gentle and largely alleviated as compared with the electric field concentration in the bottom edge adjacent region R1 of the outermost trench isolating layer 10 of the prior art shown in FIG. 26.

This provides little difference between the electric field generated in the bottom edge adjacent region RA1 of the outermost trench isolating layer 10A and the electric field generated in the bottom edge adjacent regions of the other trench isolating layers. A device breakdown voltage that is the breakdown voltage of the PN junction of the IGBT itself is not determined by the electric field generated in the bottom edge adjacent region RA1 of the outermost trench isolating layer 10A, so that the device breakdown voltage of the IGBT is improved.

Figure 3:
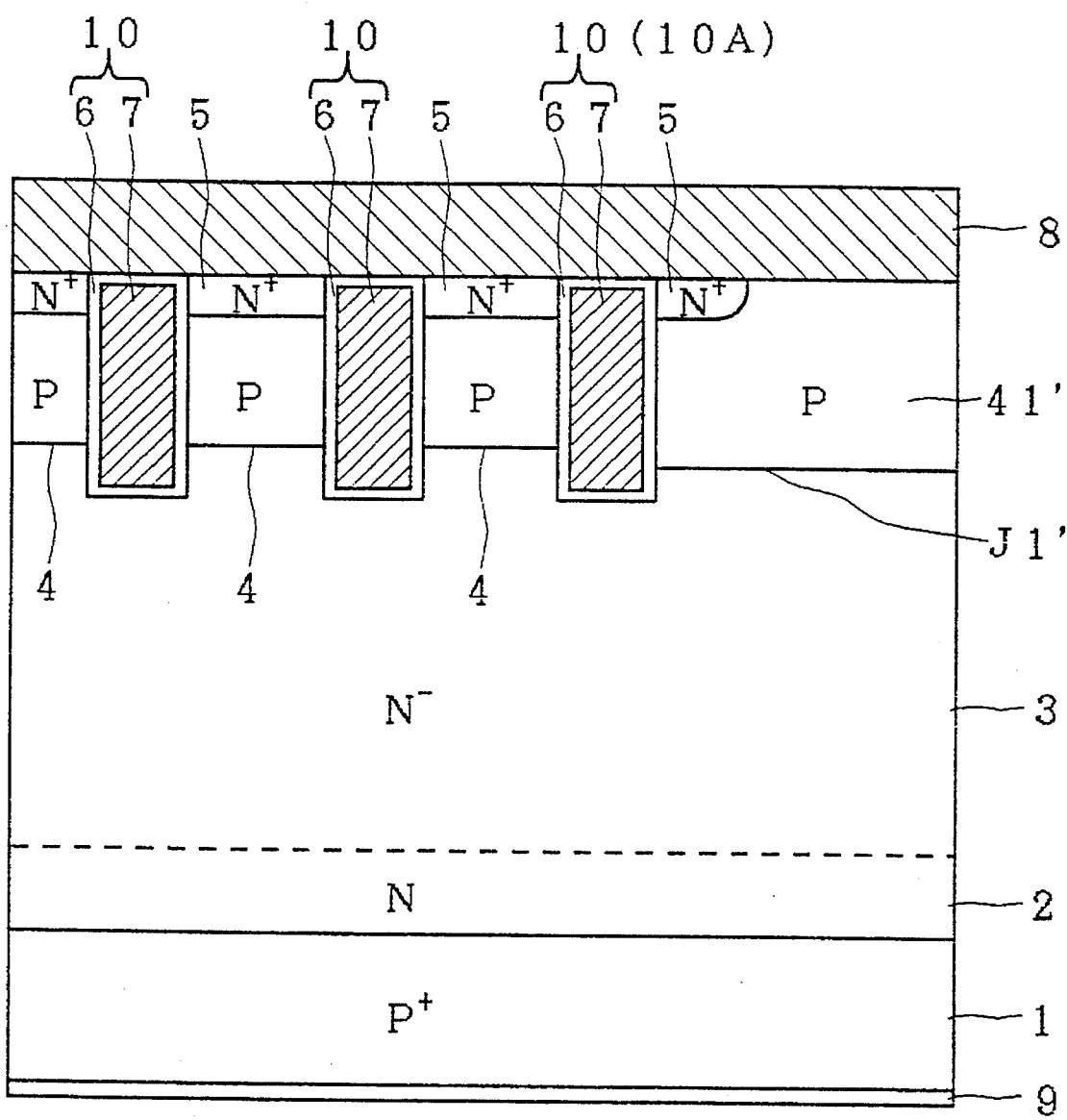
FIG. 3 is a cross-sectional view of a second mode of the IGBT of the first preferred embodiment according to the present invention.

FIG. 3 is a cross-sectional view of a second mode of the IGBT of the first preferred embodiment according to the present invention. Referring to FIG. 3, the depth of an outermost P well region 41' is more than that of the other P well regions 4 and is less than that of the trench isolating layers 10 (the gate polysilicon 7 and the oxide films 6). The other arrangements of the IGBT of the second mode are identical with those of the IGBT of the first mode in the first preferred embodiment, and the description thereof will be omitted herein.

Figure 4:
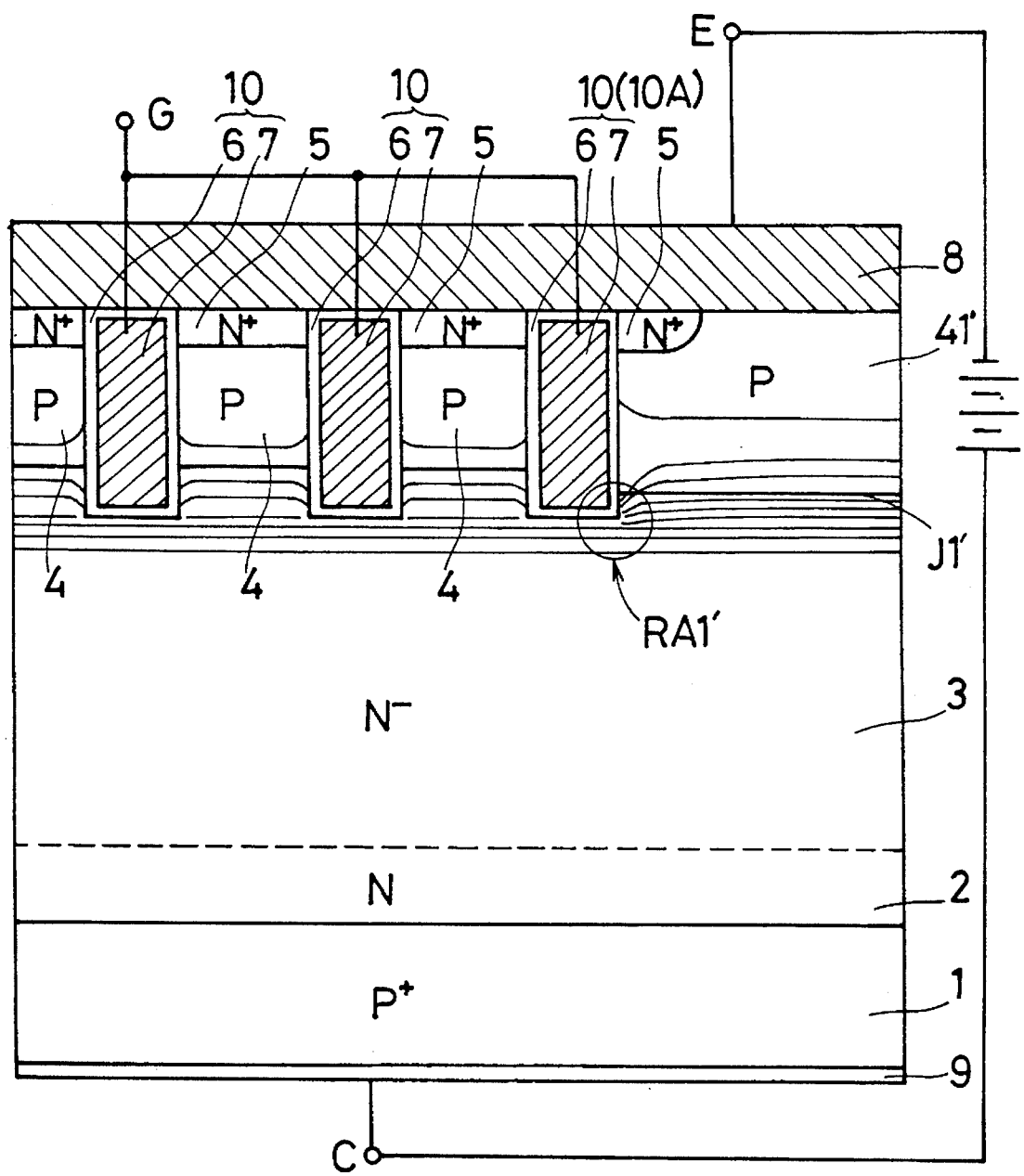
FIG. 4 illustrates a potential distribution of the second mode of the IGBT of the first preferred embodiment when it is off.

FIG. 4 shows a potential distribution of the IGBT of FIG. 3 when it is off. The electric field concentration in a bottom edge adjacent region RA1' of the outermost trench isolating layer 10A becomes gentle and largely alleviated as compared with the electric field concentration in the bottom edge adjacent region R1 of the outermost trench isolating layer 10 of the prior art shown in FIG. 26.

The second mode provides the same effect as the first mode. It is, however, apparent from the comparison between FIGS. 2 and 4 that the first mode provides a more remarkable degree of electric field concentration alleviation than the second mode. It will therefore be appreciated that the first mode is more excellent than the second mode.

Figure 5:
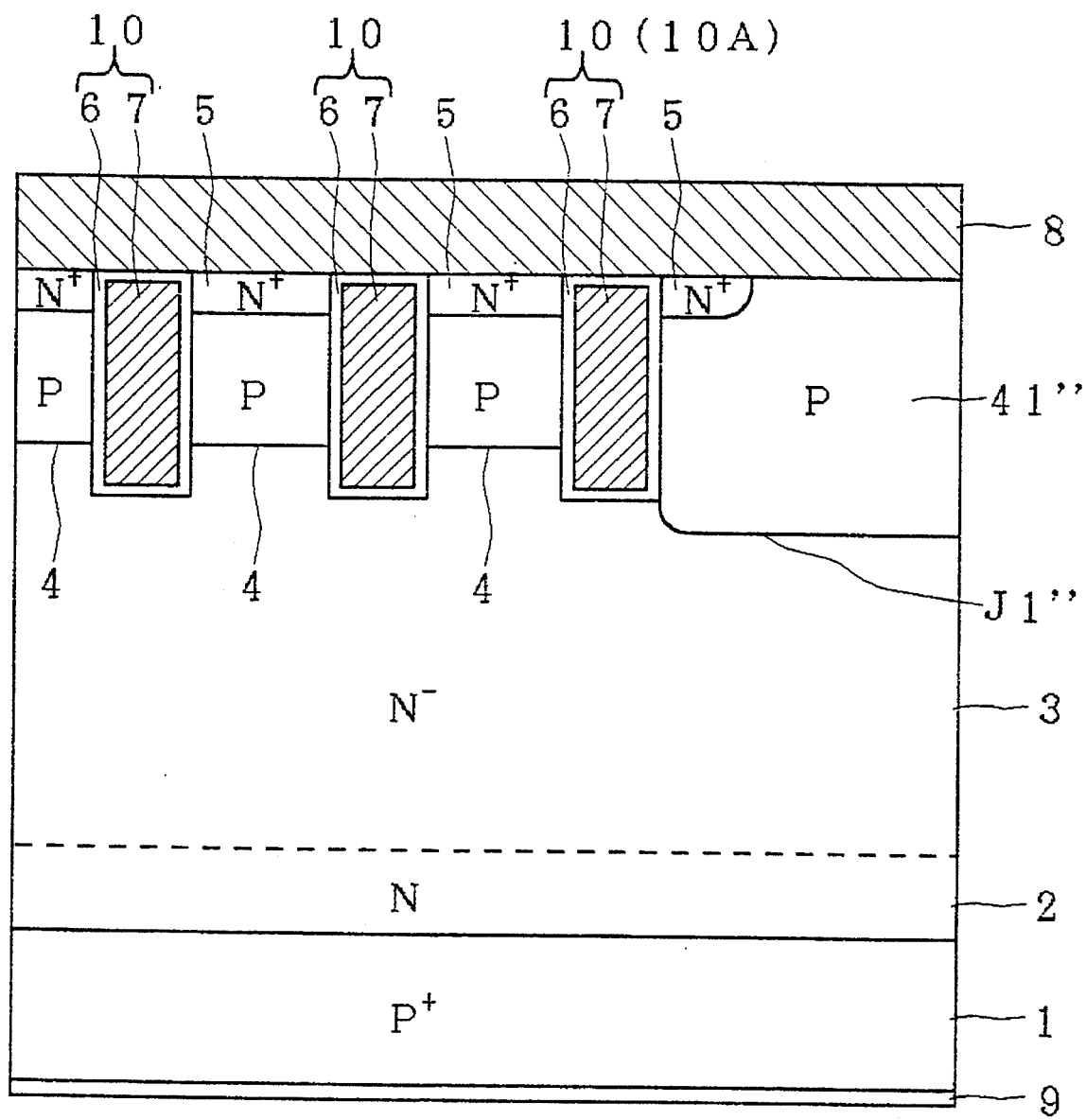
FIG. 5 is a cross-sectional view of a third mode of the IGBT of the first preferred embodiment according to the present invention.

FIG. 5 is a cross-sectional view of a third mode of the IGBT of the first preferred embodiment. Referring to FIG. 5, the depth of an outermost P well region 41" is more than that of the trench isolating layers 10. The other arrangements of the IGBT of the third mode are identical with those of the IGBT of the first mode, and the description thereof will be omitted herein.

Figure 6:
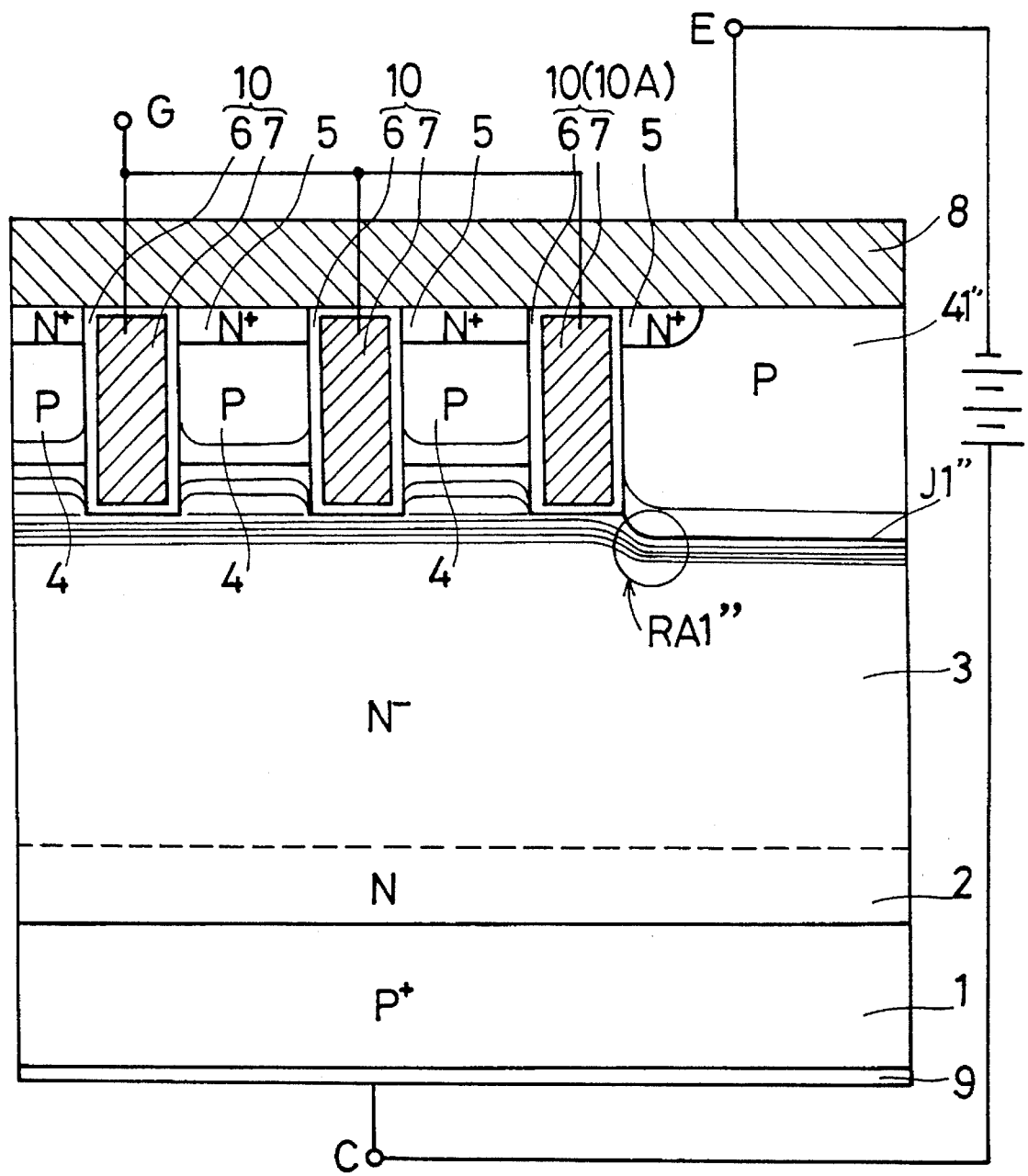
FIG. 6 illustrates a potential distribution of the third mode of the IGBT of the first preferred embodiment when it is off.

FIG. 6 shows a potential distribution of the IGBT of FIG. 5 when it is off. No electric field concentration is generated in the bottom edge adjacent region of the outermost trench isolating layer 10A. A slight electric field concentration is generated in a bottom edge adjacent region RA1" of a PN junction J1" of the outermost P well region 41". The electric field concentration in the region RA1" is however relatively gentle and largely alleviated as compared with the electric field concentration in the bottom edge adjacent region R1 of the outermost trench isolating layer 10 of the prior art shown in FIG. 26.

The third mode also provides the same effect as the first mode. It is, however, apparent from the comparison between FIGS. 2 and 6 that the degree of electric field concentration alleviation in the region RA1 of the first mode is more remarkable than that in the region RA1" of the third mode. It will therefore be appreciated that the first mode is more excellent than the third mode. In addition, the P well region 41, if made too deep, causes the N⁻ epitaxial layer 3 to be accordingly thin, which might lower the breakdown voltage of the PN junction. It may be said that the first mode is more excellent than the third mode in this respect.

Figure 7:
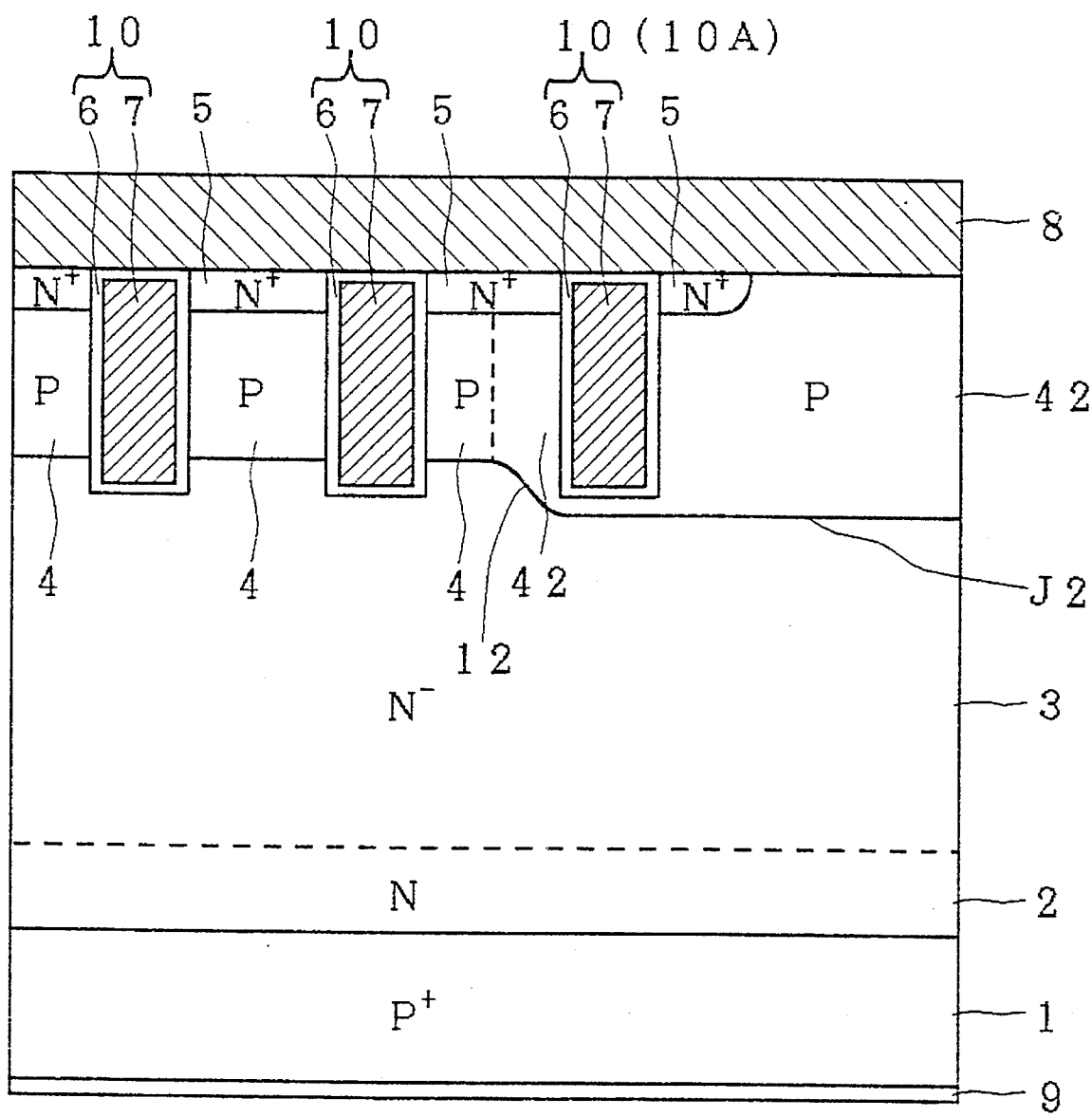
FIG. 7 is a cross-sectional view of the IGBT of a second preferred embodiment according to the present invention.

FIG. 7 is a cross-sectional view of the IGBT of trench MOS gate structure of a second preferred embodiment according to the present invention. As shown in FIG. 7, the N epitaxial layer 2 is formed on the surface of the P⁺ substrate 1, and the N⁻ epitaxial layer 3 is formed on the N epitaxial layer 2. On the N⁻ epitaxial layer 3, the plurality of P well regions 4 and a P well region 42 are formed which are insulated from each other by the plurality of trench isolating layers 10 each including the gate polysilicon 7 and the oxide film 6 therearound.

The trench isolating layers 10 are formed regularly in predetermined spaced relation with each other, and have the same depth. The N⁺ emitter region 5 is formed in the surface of each P well region 4, 42. The emitter electrode 8 is formed over the P well regions 4 and 42, the N⁺ emitter regions 5 and the trench isolating layers 10. The collector electrode 9 is formed on the lower surface of the P⁺ substrate 1.

The P well region 42 covers the outermost trench isolating layer 10A, and has a predetermined depth. The P well region 42, in a region extending outwardly from the outermost trench isolating layer 10A (in the direction of a region in which no trench isolating layer 10 is formed), has the predetermined depth, which is constantly greater than the depth of the trench isolating layers 10.

The IGBT of the second preferred embodiment, in which no channels are formed in the surface of the P well regions 4 along the side walls of the gate polysilicon 7 in the outermost trench isolating layer 10A, does not perform the MOS operation. There may be provided two or more outermost trench isolating layers 10 which are covered with the P well region 42. However, increasing the number of gate polysilicons which do not perform the MOS operation more than necessary interferes with the on-operation of the IGBT. Thus the number of trench isolating layers 10 covered with the P well region 42 is preferably smaller.

Figure 8:
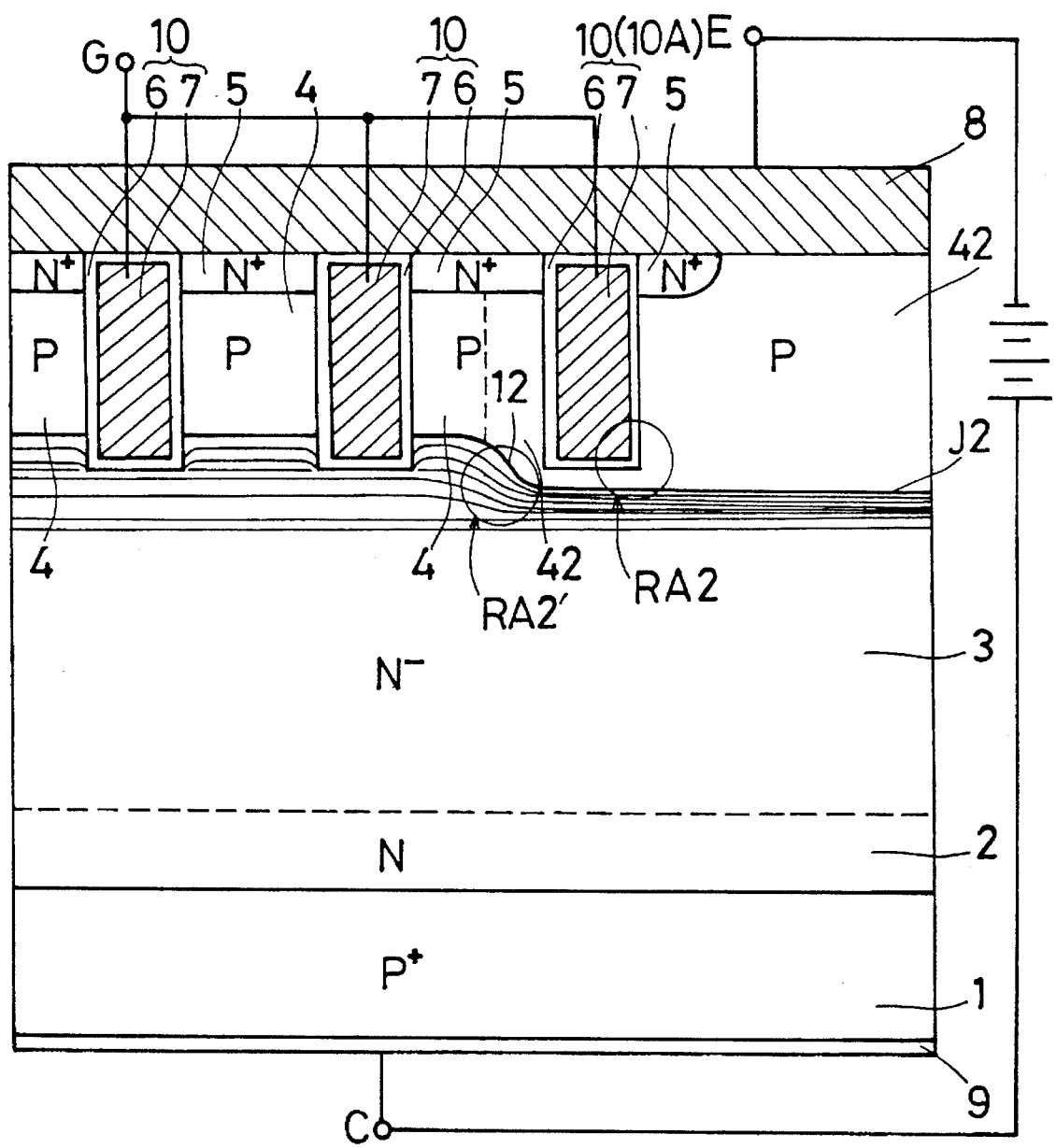
FIG. 8 illustrates a potential distribution of the IGBT of the second preferred embodiment when it is off.

In the IGBT having such arrangement, the power supply voltage is applied across the emitter electrode 8 and the collector electrode 9 such that the collector electrode is positive, as shown in FIG. 8. In this state, when the driving voltage applied to the gate polysilicon is not more than the threshold voltage, the IGBT turns off.

When the IGBT is off, a great part of the depletion layer extends toward the $N^-$ epitaxial layer 3 from a PN junction J2 biased in the reverse direction to maintain the collector voltage. Since the outermost trench isolating layer 10A is entirely covered with the P well region 42, no electric field concentration is generated in a bottom edge adjacent region RA2 of the outermost trench isolating layer 10A as shown in FIG. 8.

Thus there is no electric field concentration generated in the bottom edge adjacent region RA2 of the outermost trench isolating layer 10A, and the device breakdown voltage that is the breakdown voltage of the PN junction of the IGBT is not determined by the electric field generated in the bottom edge adjacent region RA2 of the outermost trench isolating layer 10A, so that the device breakdown voltage of the IGBT is improved. Although a slight electric field concentration is generated in a region RA2' adjacent a step portion 12 in the P well region 42, the electric field concentration may be limited to a level which does not allow the device breakdown voltage of the IGBT to be lowered by minimizing a difference in depth between the P well regions 42 and 4.

The P well region 42, if made too deep, causes the $N^-$ epitaxial layer 3 to be accordingly thin, which might lower the breakdown voltage of the PN junction. In this respect, the P well region 42 preferably has a minimum depth which permits it to entirely cover the trench isolating layer 10.

Figure 9:
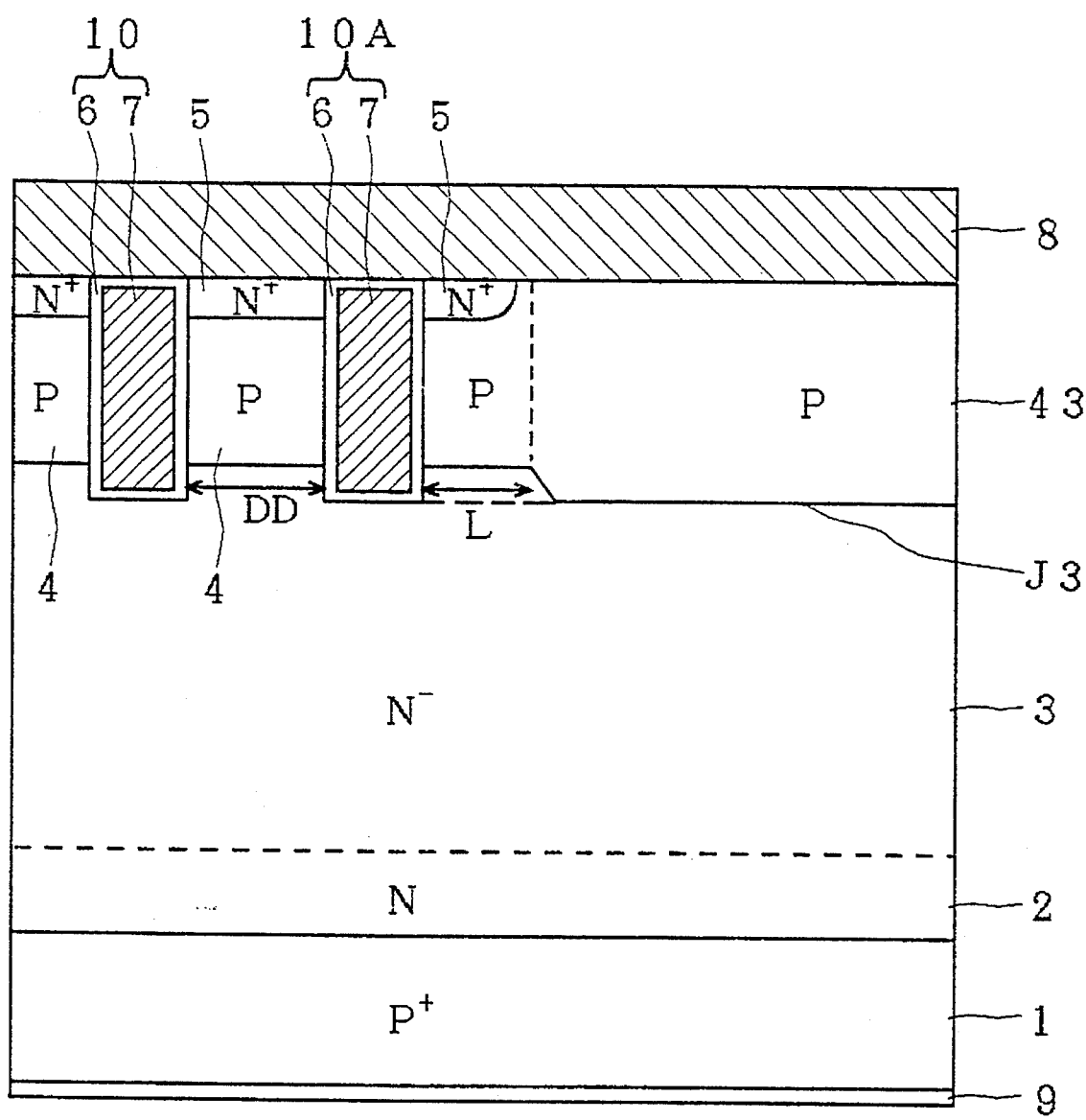
FIG. 9 is a cross-sectional view of the IGBT of a third preferred embodiment according to the present invention.

FIG. 9 is a cross-sectional view of the IGBT of trench MOS gate structure of a third preferred embodiment according to the present invention. As shown in FIG. 9, the N epitaxial layer 2 is formed on the surface of the $P^+$ substrate 1, and the $N^-$ epitaxial layer 3 is formed on the N epitaxial layer 2. On the $N^-$ epitaxial layer 3, the plurality of P well regions 4 and a P well region 43 are formed which are insulated from each other by the trench isolating layers 10 each including the gate polysilicon 7 and the oxide film 6 therearound.

The trench isolating layers 10 are regularly spaced a predetermined distance DD apart from each other and have the same depth. The $N^+$ emitter region 5 is formed in the surface of each P well region 4, 43. The emitter electrode 8 is formed over the P well regions 4 and 43, the $N^+$ emitter regions 5 and the trench isolating layers 10. The collector electrode 9 is formed on the lower surface of the $P^+$ substrate 1.

The outermost P well region 43 formed outside the outermost trench isolating layer 10A has two regions: a region within a distance L (<DD) from the outer trench isolating layer 10A which is as deep as the P well regions 4; and a region over the distance L away from the gate polysilicon 7 which is as deep as the trench isolating layers 10.

As above described, the distance L between the deeper region of the outermost P well region 43 and the outermost trench isolating layer 10A is not longer than the distance (trench-to-trench distance) DD between adjacent trench isolating layers 10. This is done to avoid the problem that, if the distance L is longer than the trench-to-trench distance DD, the degree of electric field concentration in the bottom edge of the outermost trench isolating layer 10A grows higher than that in the bottom edge of the other trench isolating layers 10 for the same reason as the prior art, so that the device breakdown voltage of the IGBT is determined by the electric field in the bottom edge of the outermost trench isolating layer 10A.

Figure 10:
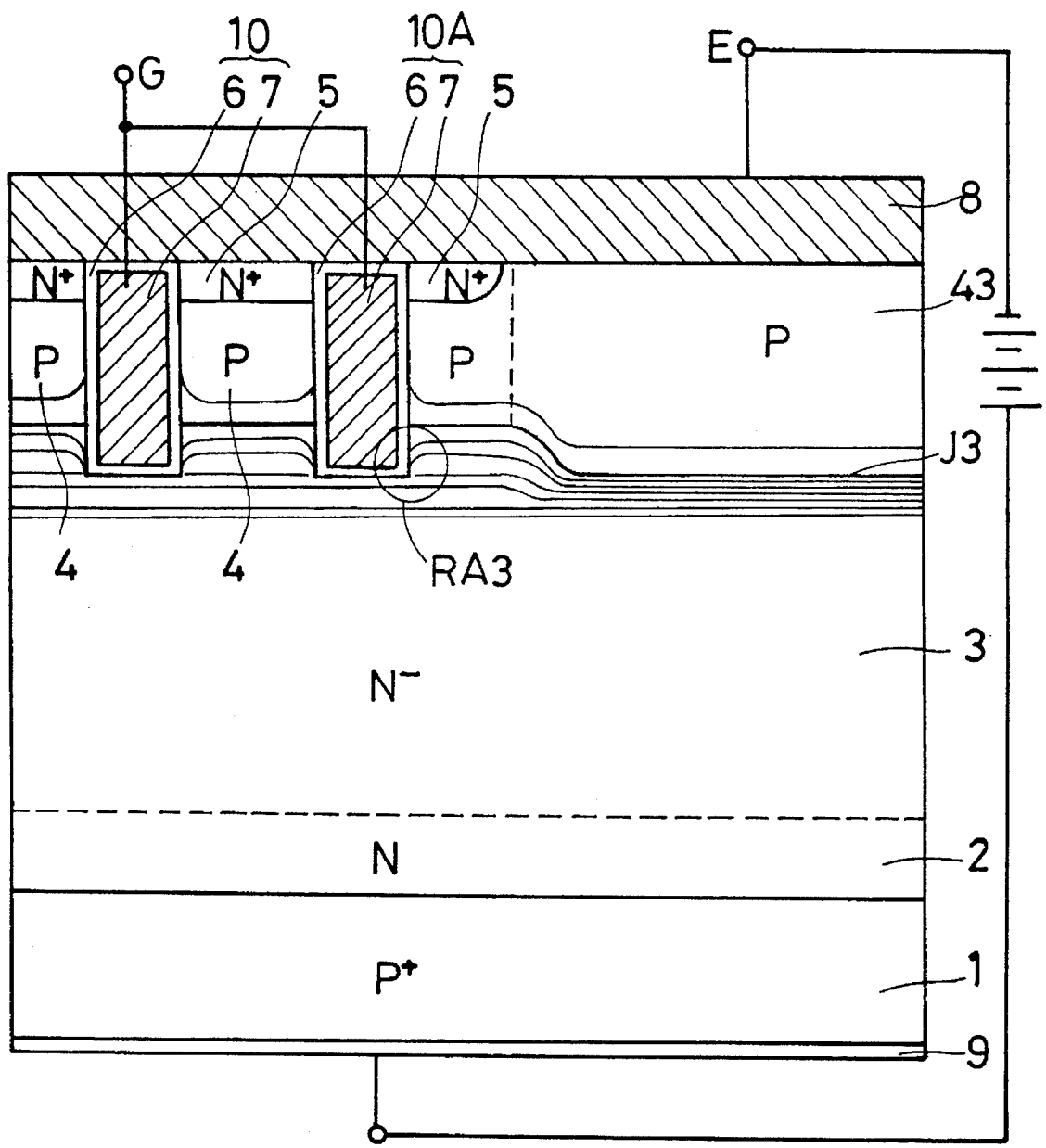
FIG. 10 illustrates a potential distribution of the IGBT of the third preferred embodiment when it is off.

In the IGBT having such arrangement, the power supply voltage is applied across the emitter electrode 8 and the collector electrode 9 such that the collector electrode 9 is positive, as shown in FIG. 10. In this state, when the driving voltage applied to the gate polysilicon 7 is not more than the threshold voltage, the IGBT turns off.

When the IGBT is off, a great part of the depletion layer extends toward the $N^-$ epitaxial layer 3 from a PN junction J3 biased in the reverse direction to maintain the collector voltage. A potential distribution at this time is shown in FIG. 10, in which the electric field concentration in a bottom edge adjacent region RA3 of the outermost trench isolating layer 10 is alleviated to the same degree as that in the bottom edge adjacent regions of the other trench isolating layers 10.

Similarly to the first and second preferred embodiments, there is little difference between the electric field generated in the bottom edge adjacent region RA3 of the outermost trench isolating layer 10 and the electric field in the other regions. The device breakdown voltage that is the breakdown voltage of the PN junction of the IGBT is not determined by the electric field generated in the bottom edge adjacent region RA3 of the outermost trench isolating layer 10, so that the device breakdown voltage of the IGBT is improved.

Figure 11:
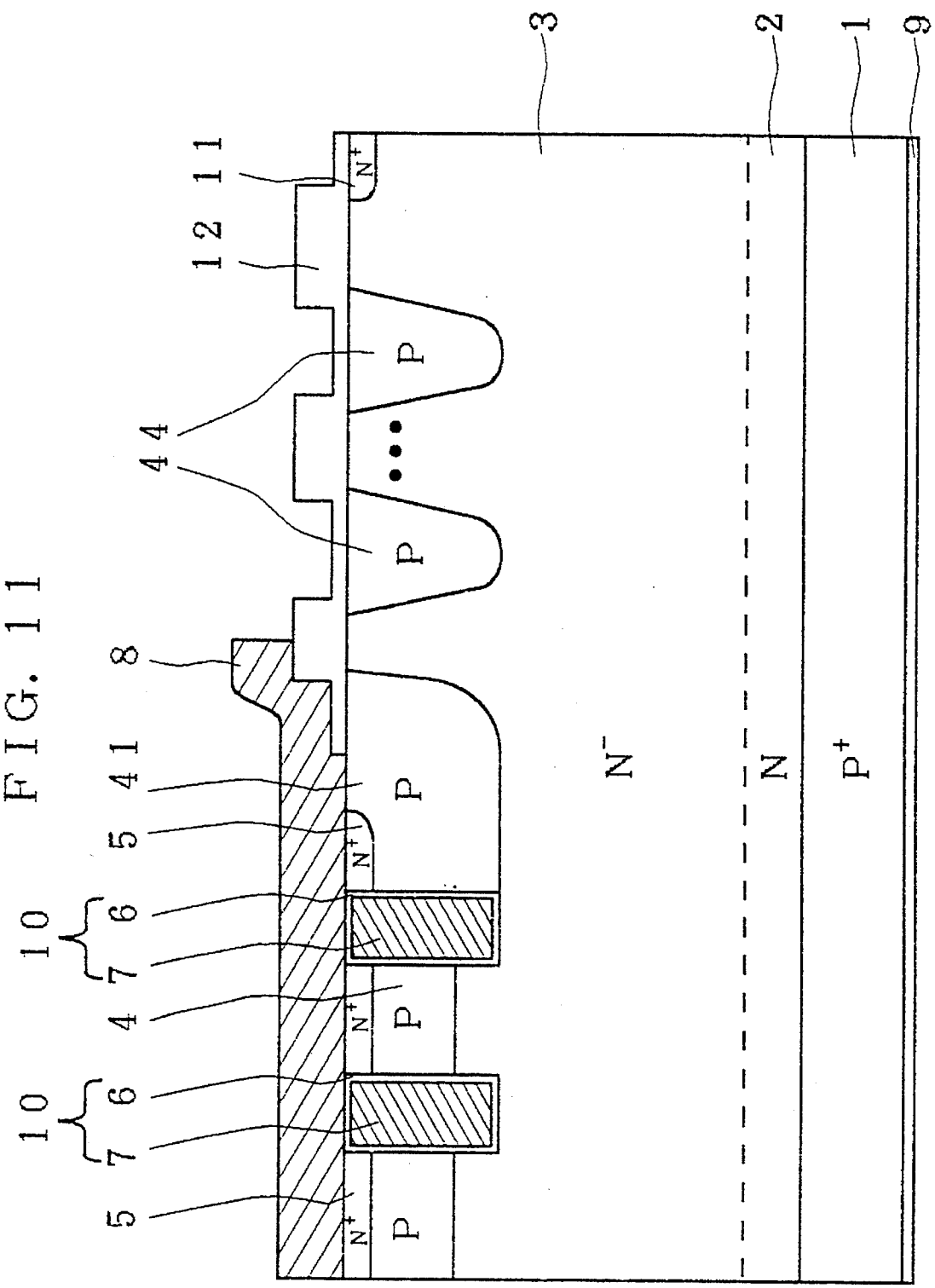
FIG. 11 is a cross-sectional view of the IGBT of a fourth preferred embodiment according to the present invention.

FIG. 11 is a cross-sectional view of the IGBT of trench MOS gate structure of a fourth preferred embodiment according to the present invention. Referring to FIG. 11, P type guard ring regions 44 that are as deep as the P well region 41 are formed in a surface region of the $N^-$ epitaxial layer 3 which extends outwardly of the P well region 41 (a region extending in the direction in which the P well regions 4 are absent). Reference numeral 11 designates an $N^+$ diffusion region serving as a channel stopper, and 12 designates an insulating film. The other arrangements of the IGBT of the fourth preferred embodiment are identical with those of the IGBT of the first preferred embodiment, and the description thereof will be omitted herein.

Figure 12:
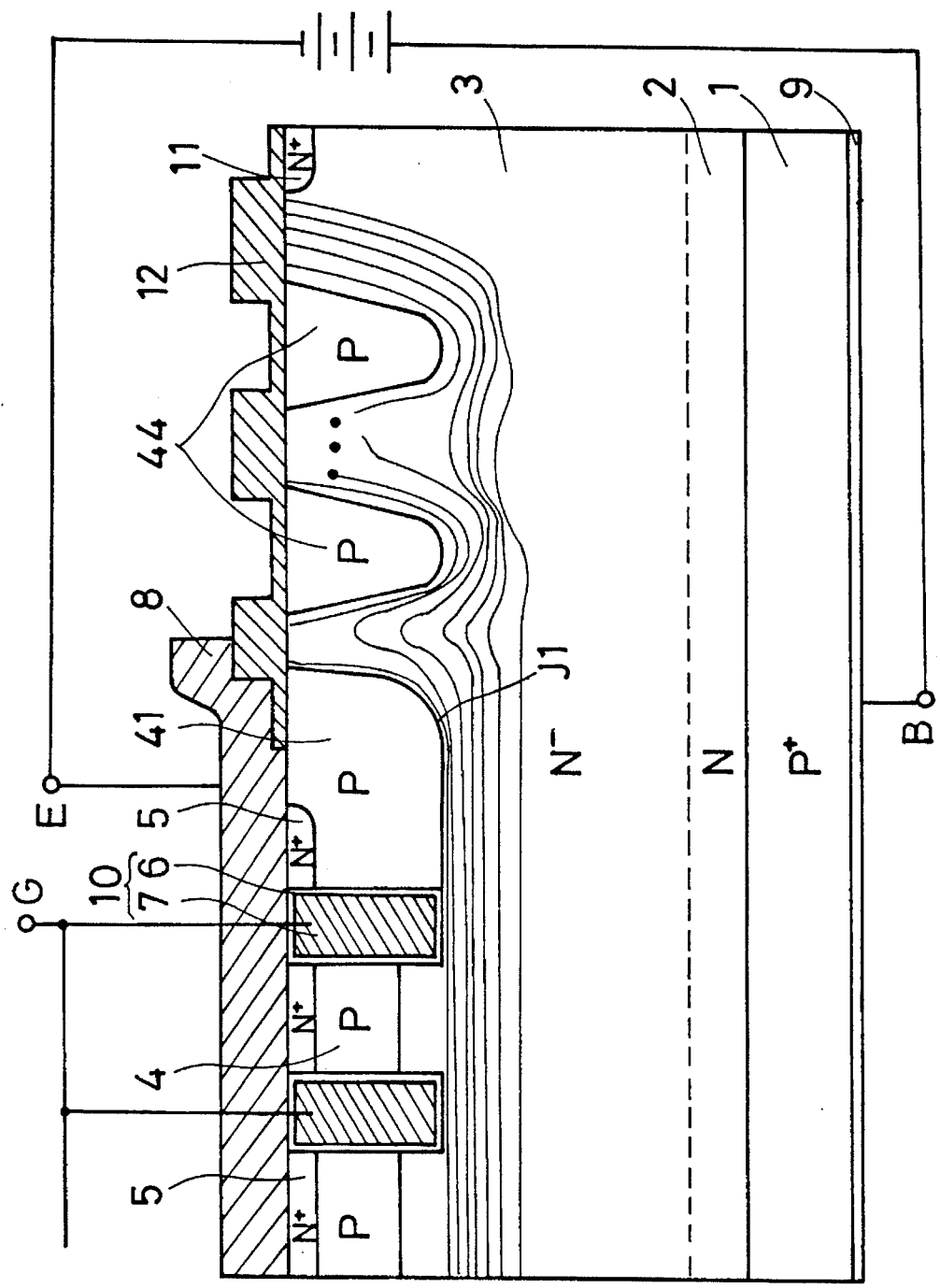
FIG. 12 illustrates a potential distribution of the IGBT of the fourth preferred embodiment when it is off.

FIG. 12 illustrates a potential distribution of the IGBT, in cross section, of the fourth preferred embodiment when the IGBT is off. The P type guard ring regions 44 are made as deep as the P well regions 41, so that a smooth potential distribution is provided between the P well region 41 and the P type guard ring regions 44. Thus the electric field concentration which causes the device breakdown voltage to be lowered is not generated between the P well region 41 and the P type guard ring regions 44.

Figure 30:
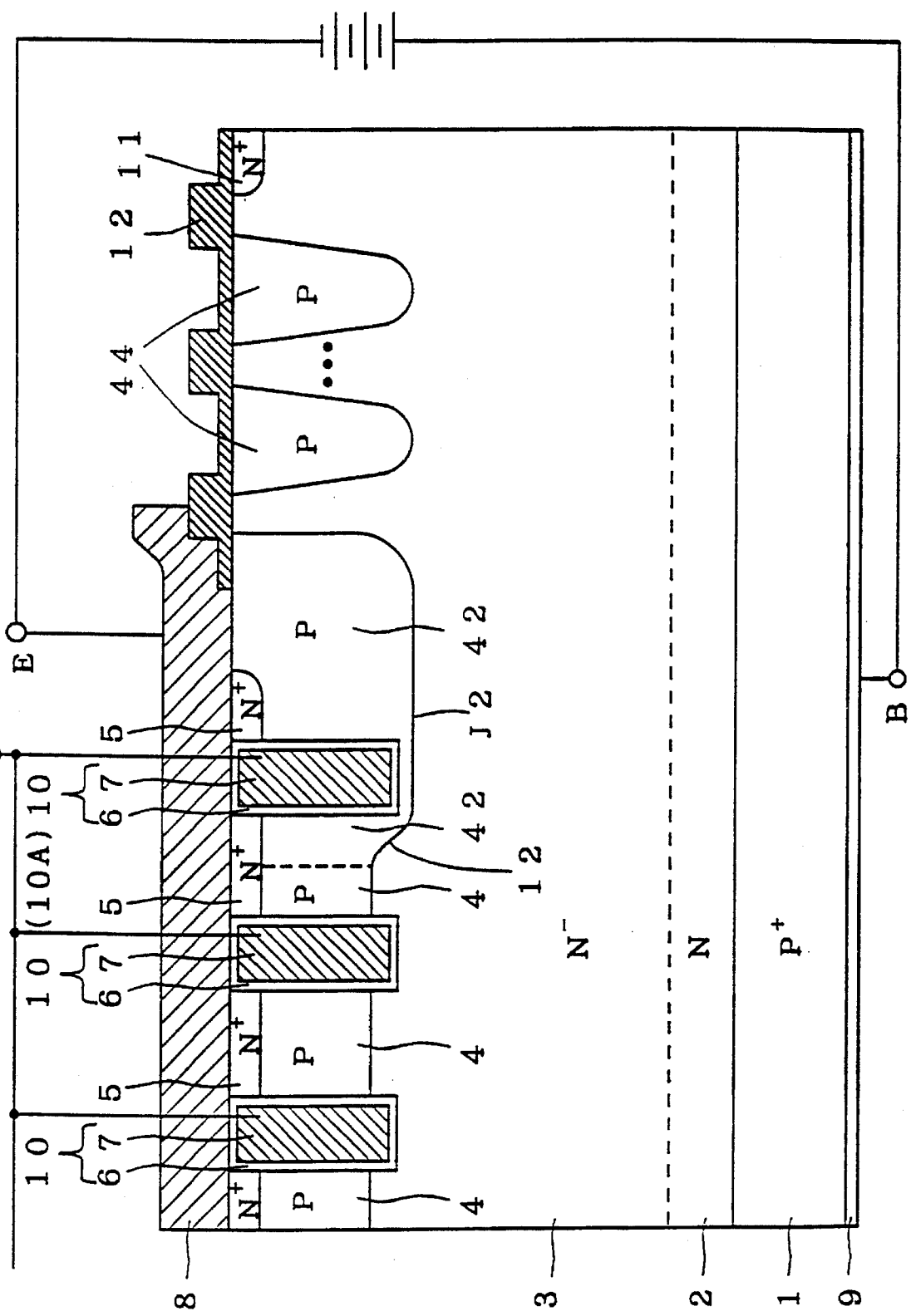
FIG. 30 is a cross-sectional view of the IGBT of the second preferred embodiment according to the invention including the provision of guard ring regions.

As shown in FIG. 30, the IGBT of the second preferred embodiment may provide the same effect as the fourth preferred embodiment by the provision of guard ring regions corresponding to the P type guard ring regions 44 which are as deep as the P well region 42 in a surface region of the $N^-$ epitaxial layer 3 which extends outwardly of the P well region 42 (a region extending in the direction in which the P well regions 4 are absent).

As shown in FIG. 31, similarly, the IGBT of the third preferred embodiment may provide the same effect as the fourth preferred embodiment by the provision of guard ring regions corresponding to the P type guard ring regions 44 which are as deep as the deeper region of the P well region 43 in a surface region of the N⁻ epitaxial layer 3 which extends outwardly of the P well region 43 (a region extending in the direction in which the P well regions 4 are absent).

FIGS. 13 to 23 illustrate a method of fabricating the IGBT of the first preferred embodiment. FIGS. 13 to 19 are cross-sectional views and FIGS. 20 to 23 are plan views. Referring to FIGS. 13 to 23, description will be given hereinafter on the method of fabricating the IGBT of the first preferred embodiment.

Figure 13:
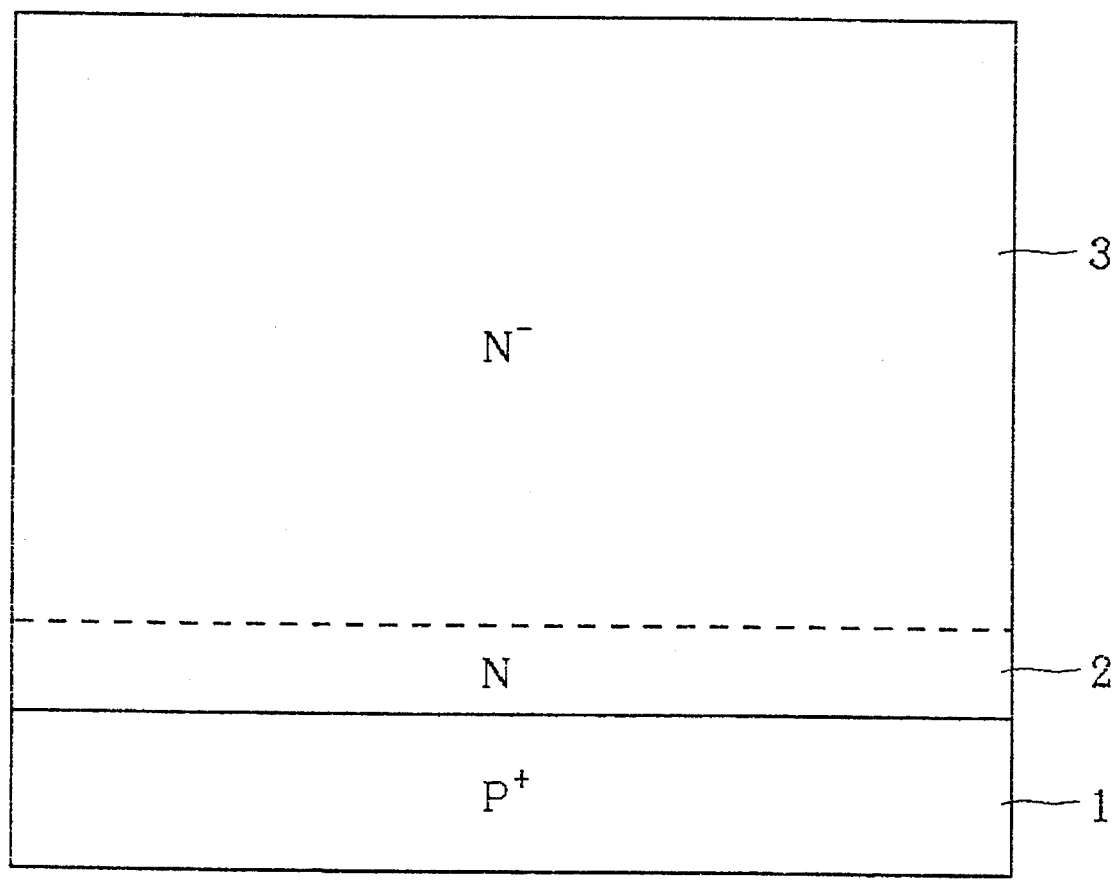
FIGS. 13 to 19 are cross-sectional views showing a method of fabricating the IGBT of the first to third preferred embodiments.

As shown in FIG. 13, the N epitaxial layer 2 is formed on the P⁺ substrate 1 by epitaxial process, and the N⁻ epitaxial layer 3 is then formed on the N epitaxial layer 2 by epitaxial process.

Figure 14:
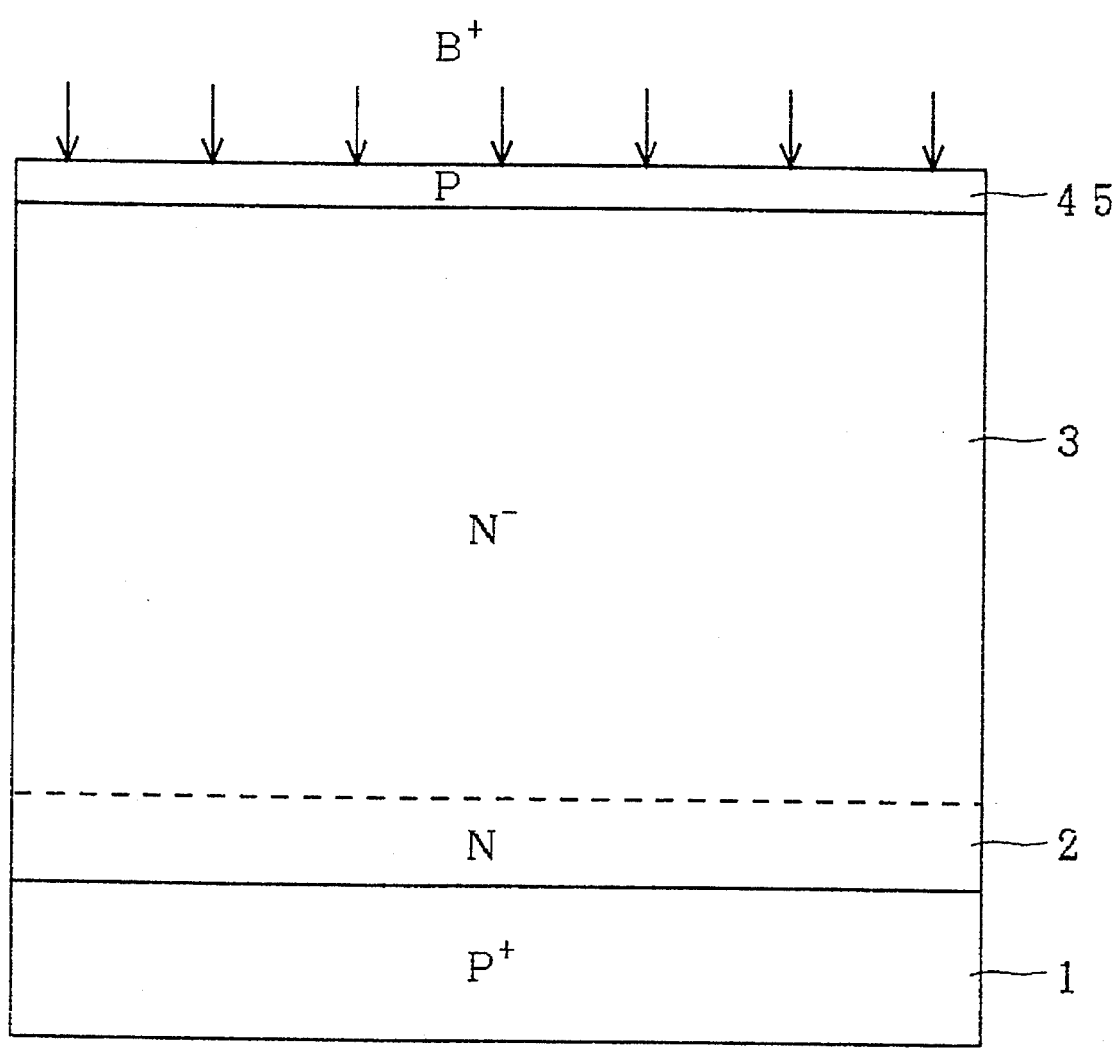

As shown in FIG. 14, P type impurities such as boron are deposited onto the surface of the N⁻ epitaxial layer 3 to form a P deposition region 45 on the N⁻ epitaxial layer 3. The deposition of P type impurities is carried out by means of ion implantation into the shaded region 21 of FIG. 20. A cross section taken along the line A—A of FIG. 20 corresponds to FIG. 14.

Figure 15:
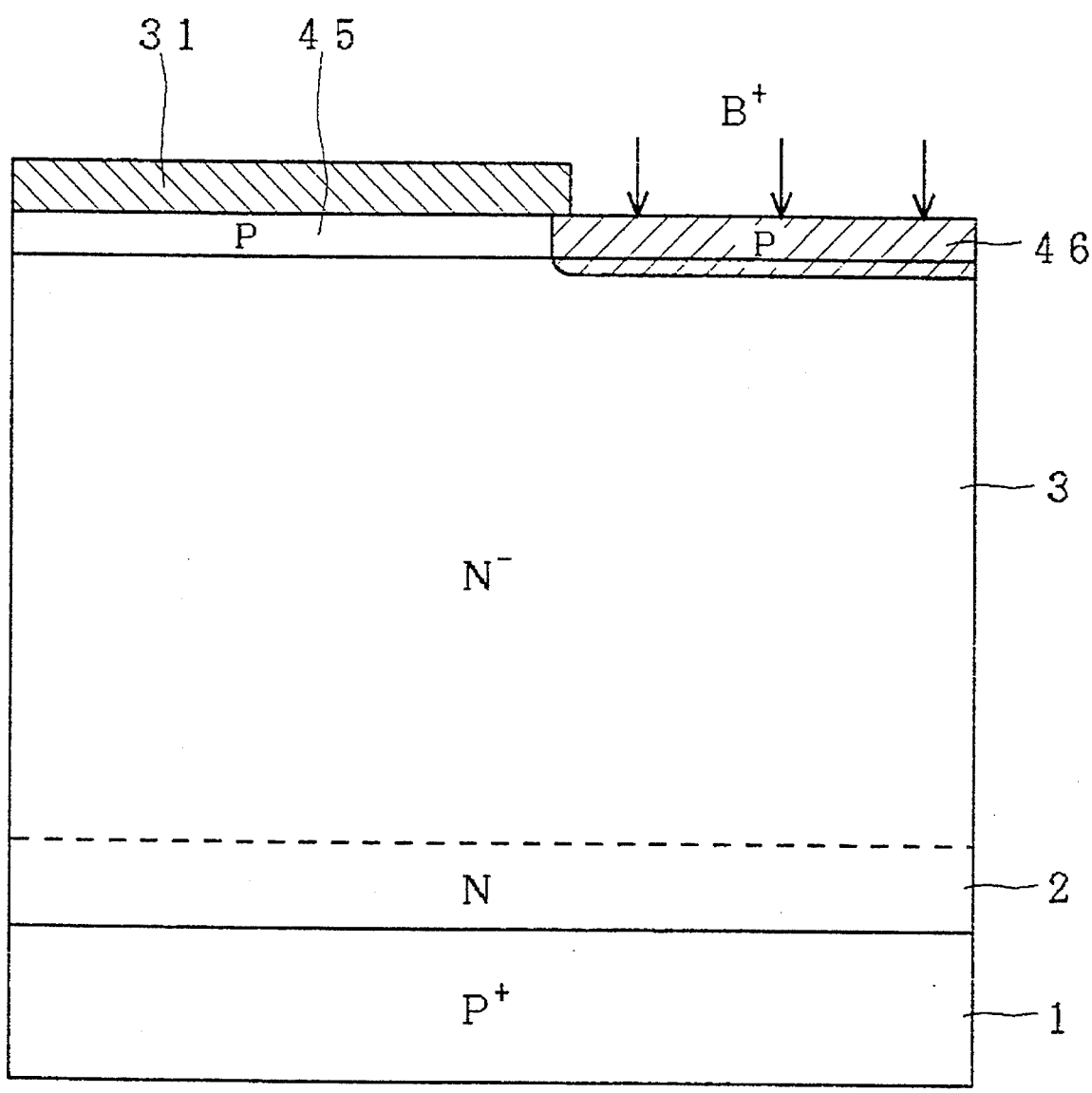
Figure 21:
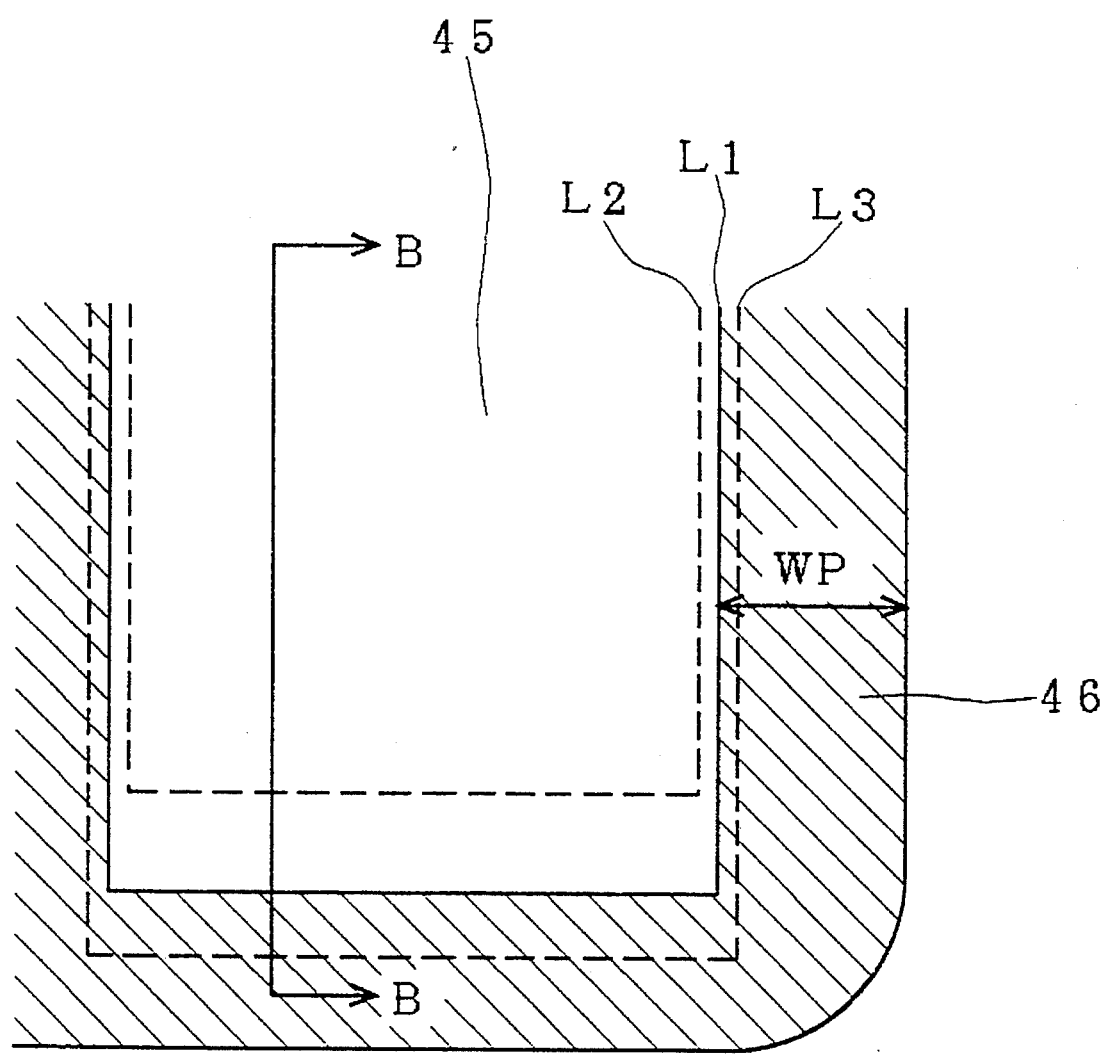

A patterned mask material 31 is formed on part of the P deposition region 45, as shown in FIG. 15. Using the mask material 31 as a mask, P type impurities are deposited again onto the P deposition region 45 to form a P deposition region 46 having a larger amount of impurities than the P deposition region 45. In FIG. 21, there is illustrated a plan structure of the P deposition regions 45 and 46. A cross section taken along the line B—B of FIG. 21 corresponds to FIG. 15.

By adjusting the configuration of the patterned mask material 31, the width WP (FIG. 21) of the P deposition region 46 is set to L1.

Figure 16:
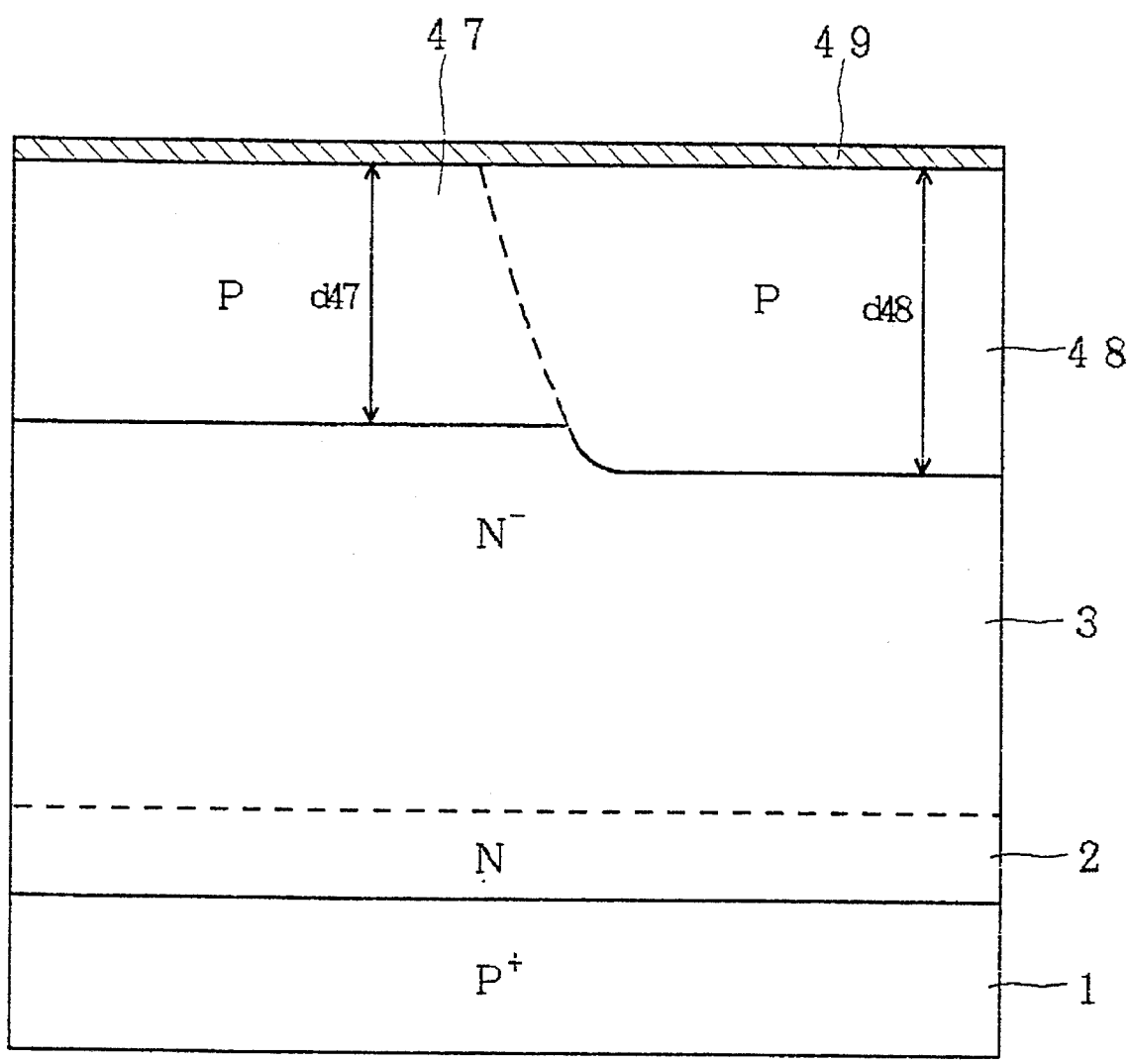

The P deposition regions 45 and 46 are heat-treated to form a P region 47 having a depth d47 and a P region 48 having a depth d48 (>d47) as shown in FIG. 16. Reference numeral 49 designates an oxide film.

Figure 17:
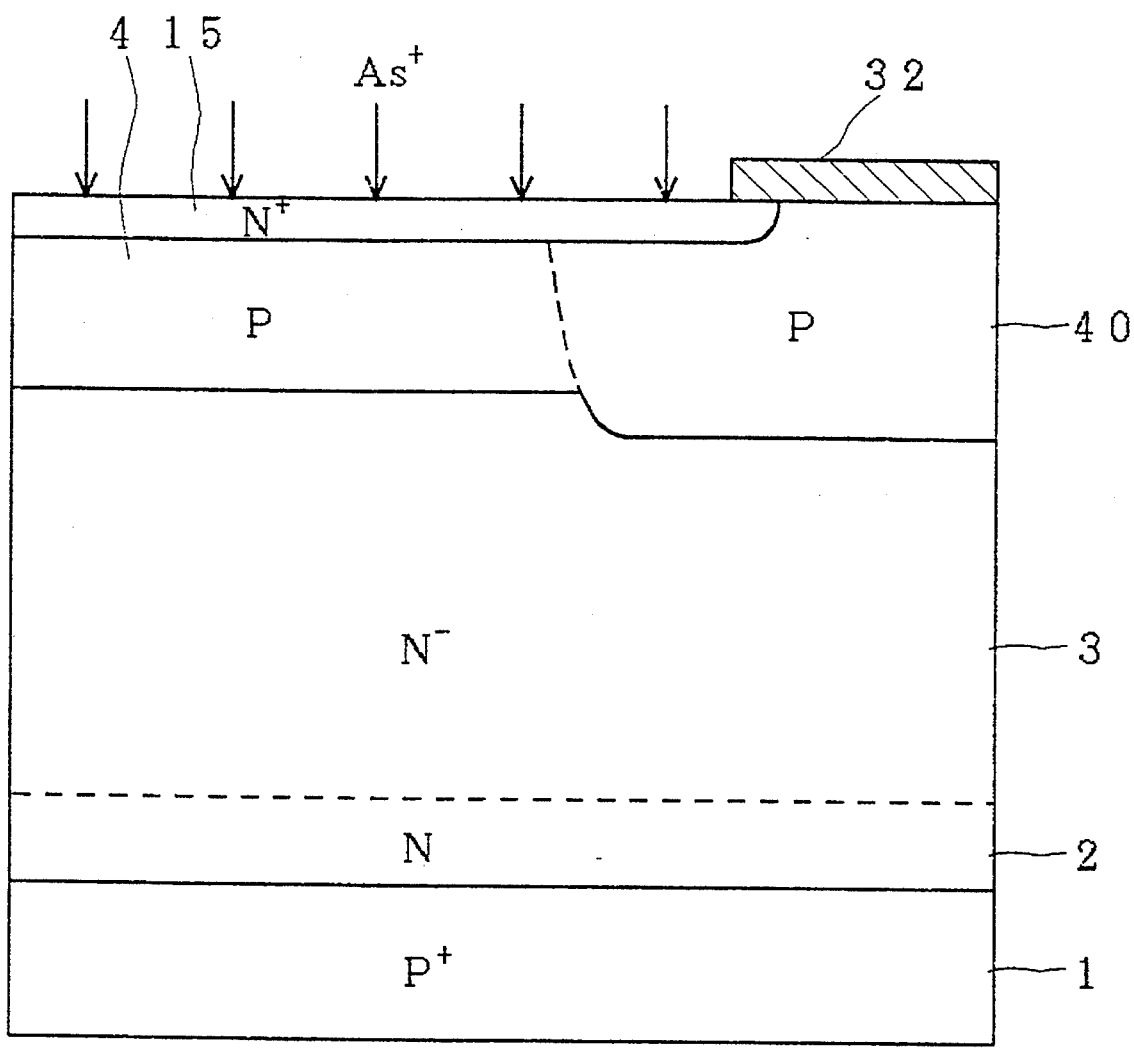
Figure 22:
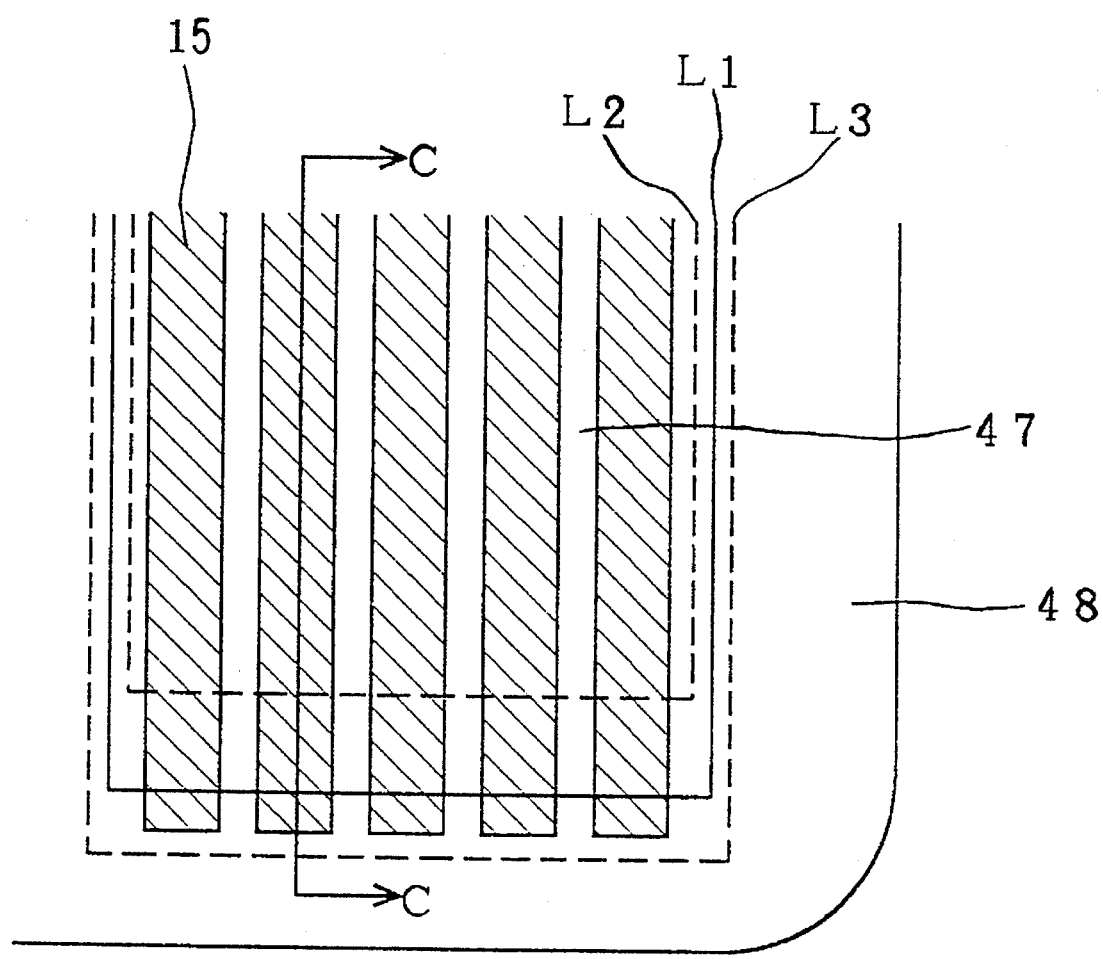

Then patterning is carried out as shown in FIG. 17 to form a patterned mask material 32. Using the mask material 32 as a mask, N type impurities such as arsenic are selectively deposited onto the surface of the P regions 47 and 48, and are then diffused by heat treatment to form an N⁺ diffusion region 15. FIG. 22 is a plan view of the N⁺ diffusion region 15. A cross section taken along the line C—C of FIG. 22 corresponds to FIG. 17.

Figure 18:
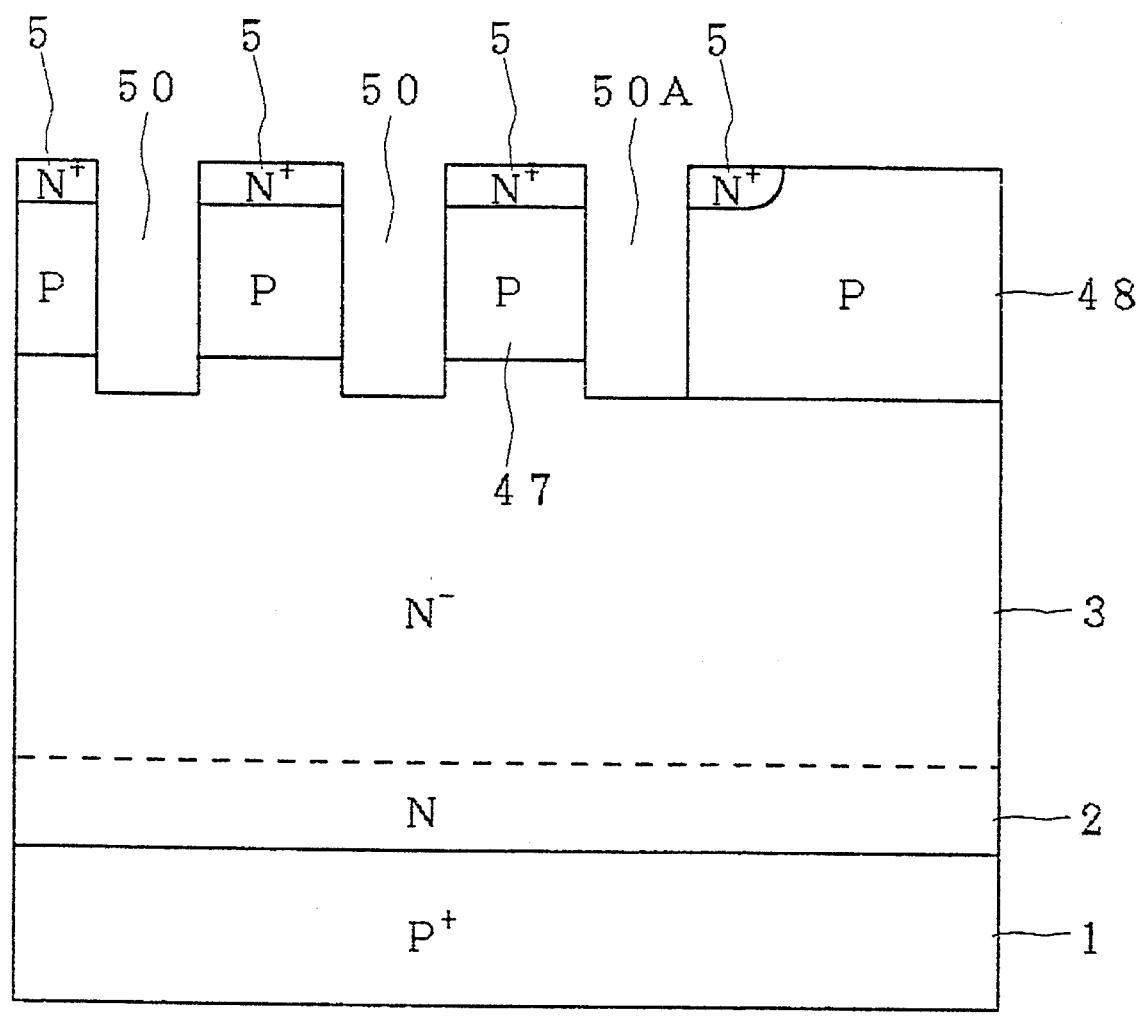

As shown in FIG. 18, a plurality of trenches 50 are selectively formed which extend from the surface of the N⁺ diffusion region 15 through the P region 47 to the same depth as the P region 48. The outermost trench 50A is adapted to be formed about the boundary between the P regions 47 and 48. As a result, the P regions 47 and 48 are insulated from each other by the trenches 50, so that the P well regions 4 having the depth d47 and the P well region 41 having the width d48 are formed. The N⁺ emitter region is formed in the surface of each P well region 4, 41.

Figure 19:
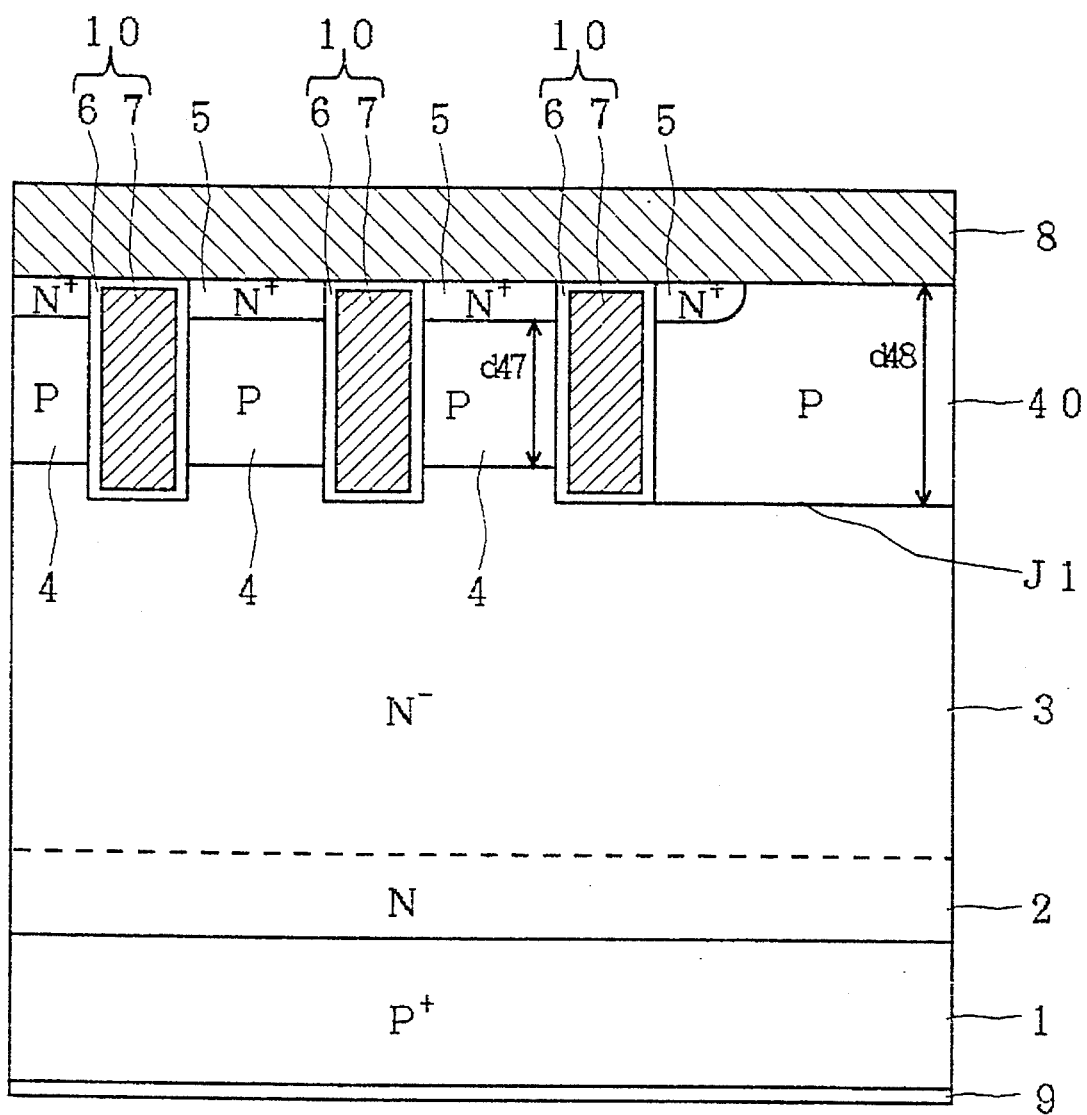
Figure 20:
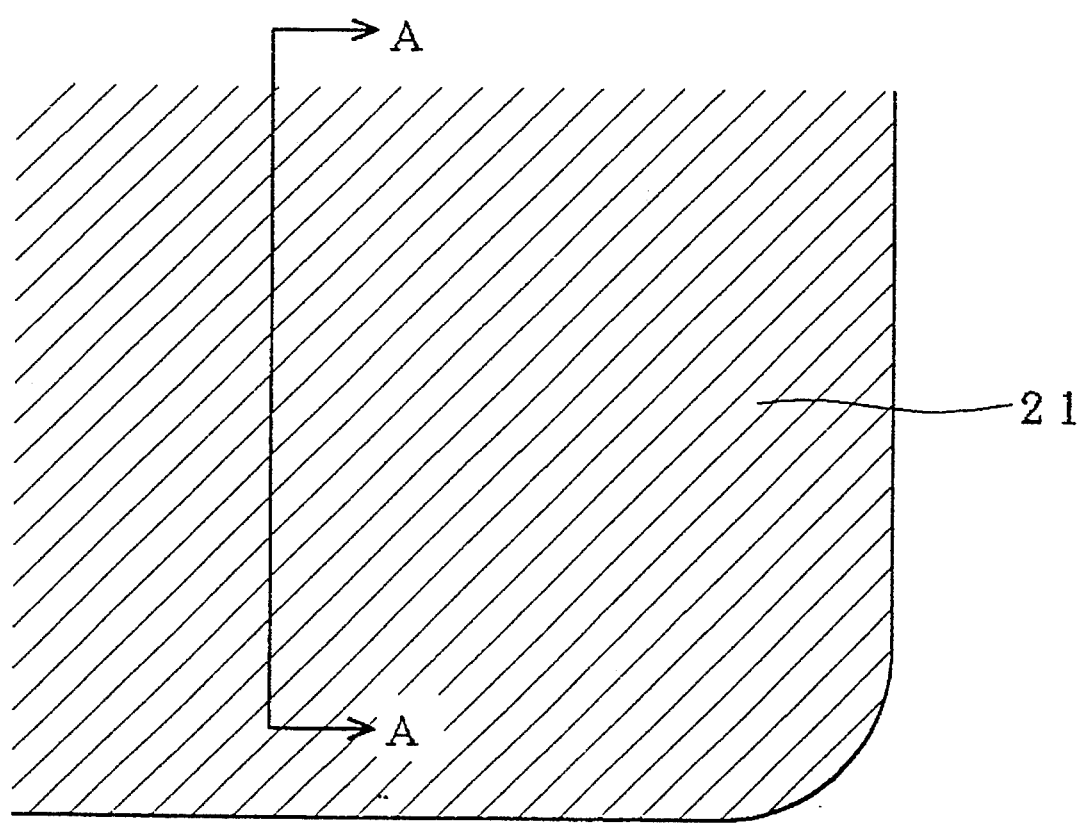
FIGS. 20 to 23 are plan views showing the method of fabricating the IGBT of the first to third preferred embodiments.
Figure 23:
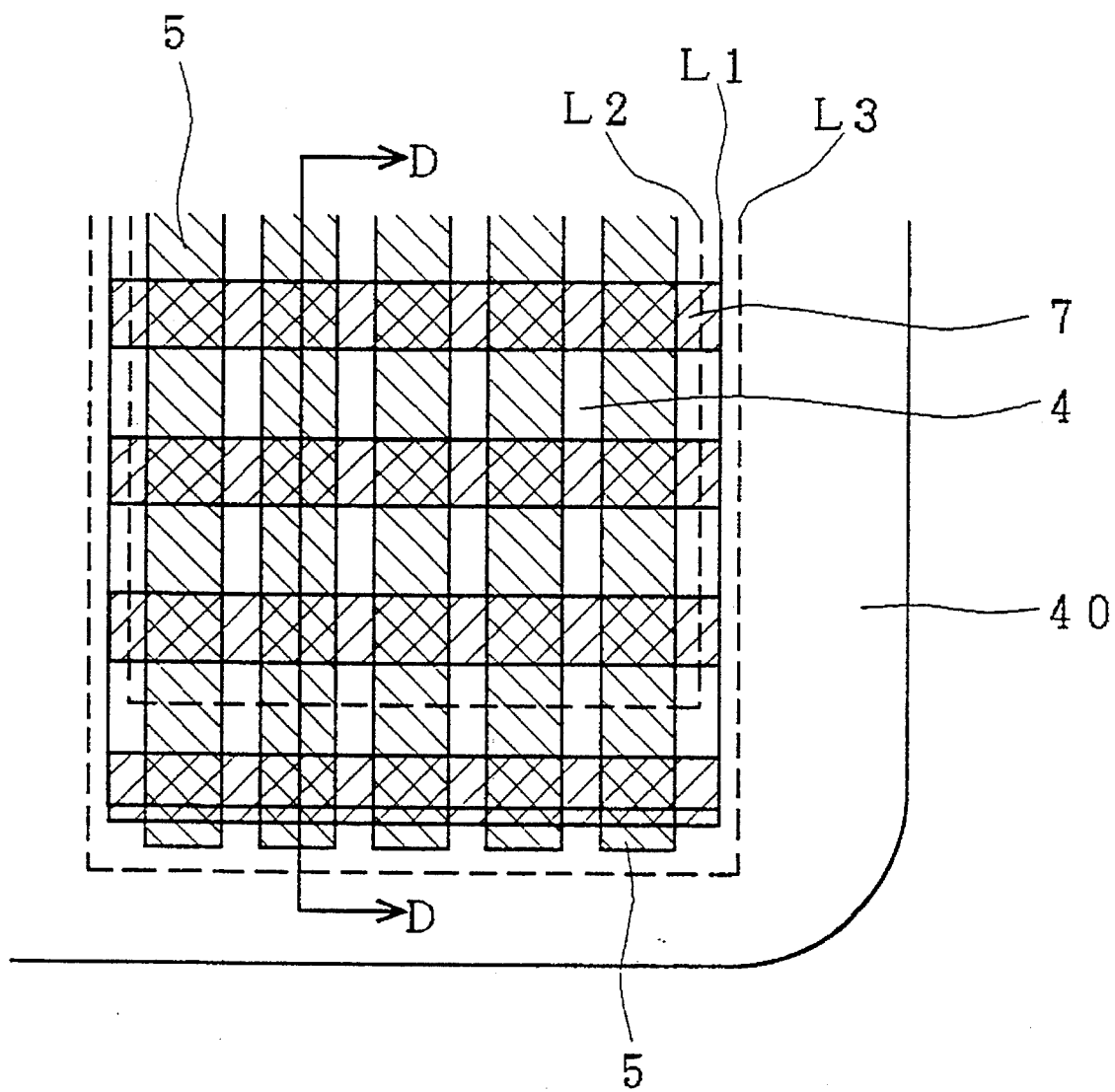

As shown in FIG. 19, a thin oxide film is formed over the inner peripheral surface of each trench 50. The trenches 50 having the surfaces on which the oxide films are formed are filled with polysilicon to form the gate polysilicon 7. An oxide film is formed on the surface of the gate polysilicon 7 to form the oxide film 6 enclosing the gate polysilicon 7. The trench isolating layers 10 are completed each of which includes the gate polysilicon 7 and the oxide film 6. The emitter electrode 8 is formed over the top surface, and the collector electrode 9 is formed over the bottom surface of the P⁺ substrate 1, so that the IGBT is completed. FIG. 23 is a plan view of the accomplished IGBT. A cross section taken along the line D—D of FIG. 23 corresponds to FIG. 19.

The IGBT of the second preferred embodiment may be fabricated in the same manner. Description will be given hereinafter on the method of fabricating the IGBT of the second preferred embodiment, particularly on differences from the method of fabricating the IGBT of the first preferred embodiment.

The same process steps as those of the method of the first preferred embodiment are carried out until the P deposition region 45 is formed, and the description thereof will be omitted herein.

After the formation of the P deposition region 45, the patterned mask material 31 is formed on part of the P deposition region 45 as shown in FIG. 15. Using the mask material 31 as a mask, P type impurities are deposited again onto the P deposition region 45 to form the P deposition region 46 having a larger amount of impurities than the P deposition region 45.

By adjusting the configuration of the patterned mask material 31, the width WP (FIG. 21) of the P deposition region 46 is set to L2. The P deposition region 46 is formed such that it extends more inwardly than the deposition region 46 of the first preferred embodiment.

Subsequently the same process steps as those of the method of the first preferred embodiment are carried out until the N⁺ diffusion region 15 is formed, and the description thereof will be omitted herein.

After the formation of the N⁺ diffusion region 15, the plurality of trenches 50 are selectively formed which extend from the surface of the N⁺ diffusion region 15 through the P region 47 such that the outermost trench 50A is buried in the P region 48. As a result, the P regions 47 and 48 are insulated from each other by the trenches 50, so that the P well regions 4 and the P well region 42 covering the outermost trench 50A are formed.

The same subsequent process steps as those of the method of the first preferred embodiment are carried out, and the description thereof will be omitted herein.

The IGBT of the third preferred embodiment may be fabricated in the same manner. Description will be given hereinafter on the method of fabricating the IGBT of the third preferred embodiment, particularly on differences from the method of the first preferred embodiment.

The same process steps as those of the method of the first preferred embodiment are carried out until the P deposition region 45 is formed, and the description thereof will be omitted herein.

After the formation of the P deposition region 45, the patterned mask material 31 is formed on part of the P deposition region 45 as shown in FIG. 15. Using the mask material 31 as a mask, P type impurities are deposited again onto the P deposition region 45 to form the P deposition region 46 having a larger amount of impurities than the P deposition region 45.

By adjusting the configuration of the patterned mask material 31, the width WP (FIG. 21) of the P deposition region 46 is set to L3. The P deposition region 46 is formed the width of which is shorter than that of the deposition region 46 of the first preferred embodiment.

Subsequently the same process steps as those of the method of the first preferred embodiment are carried out until the N⁺ diffusion region 15 is formed, and the description thereof will be omitted herein.

Then, as shown in FIG. 18, the plurality of trenches 50 are selectively formed which extend from the surface of the N⁺ diffusion region 15 through the P region 47 to the same depth as the P region 48 such that the outermost trench 50A extends through the P region 47 spaced the distance L apart from the P region 48. As a result, the P regions 47 and 48 are insulated from each other by the trenches 50, so that the plurality of P well regions 4 having the depth d47 and the P well region 43 having the depth d47 in the region within the distance L from the outermost trench 50A and having the depth d48 in the region over the distance L therefrom are formed. The N$^+$ emitter region 5 is formed in the surface of each P well region 4, 43.

The same subsequent process steps as those of the method of the first preferred embodiment are carried out, and the description thereof will be omitted herein.

The guard ring regions 44 of the IGBT of the fourth preferred embodiment may be formed by forming an overlap region between the P deposition regions 45 and 46 in a guard ring formation region on the N$^-$ epitaxial layer 3 and then performing heat treatment.

Figure 29:
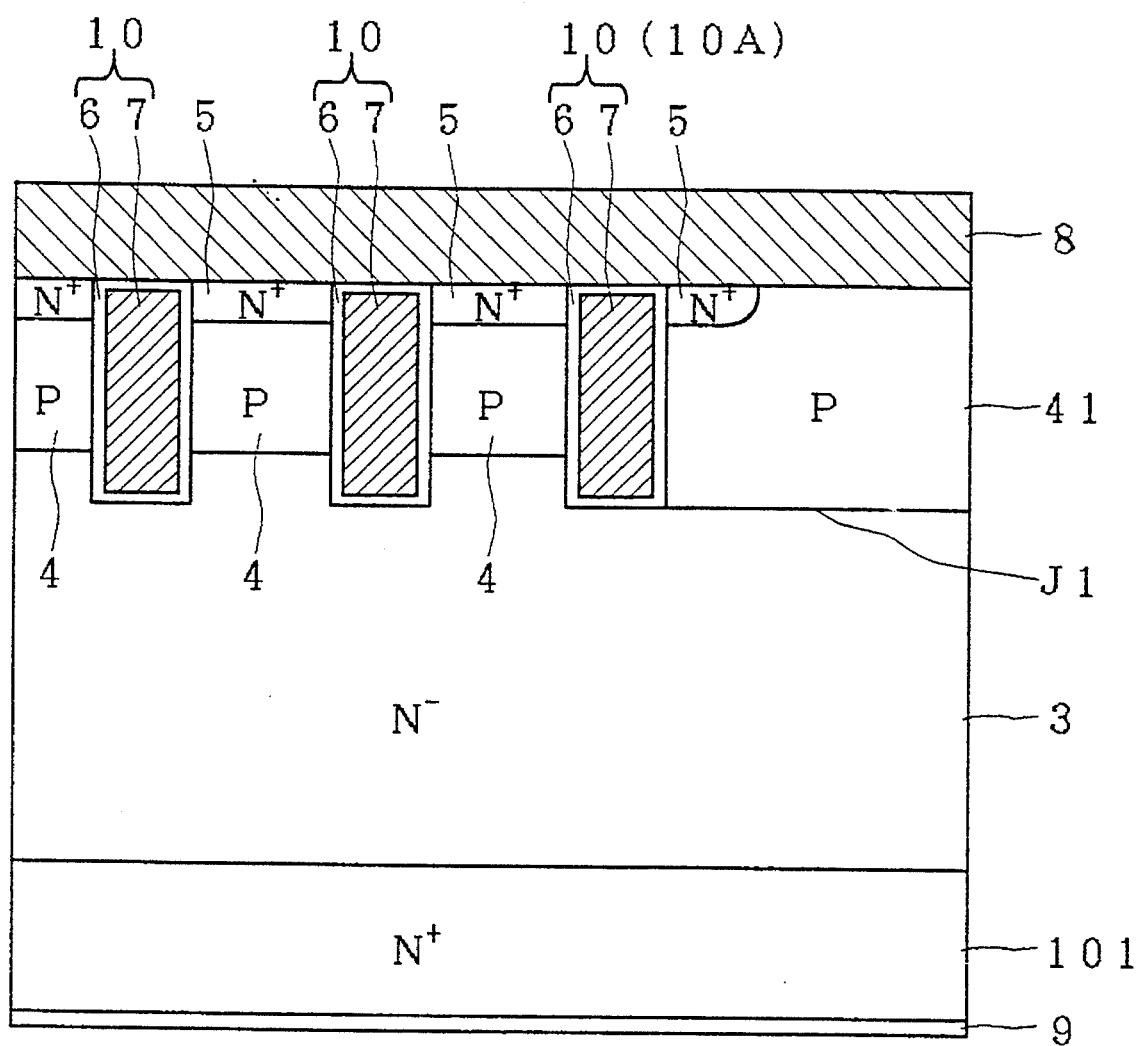
FIG. 29 is a cross-sectional view of a MOSFET having a trench MOS gate to which the present invention is applied.

The first to fourth preferred embodiments disclose the IGBT having the trench MOS gates. The present invention, however, may be applied to an MOSFET having the trench MOS gates wherein an N$^+$ substrate 101 is substituted for the P$^+$ substrate 1 of the IGBT of the first to fourth preferred embodiments and the N epitaxial layer 2 is absent, as shown in FIG. 29.

Figure 24:
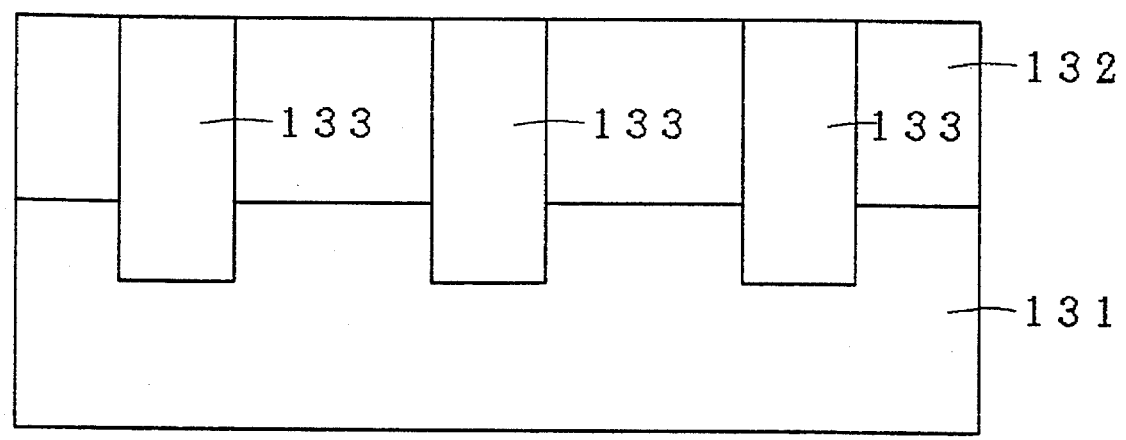
FIG. 24 is a cross-sectional view showing the basic structure of the present invention.
Figure 25:
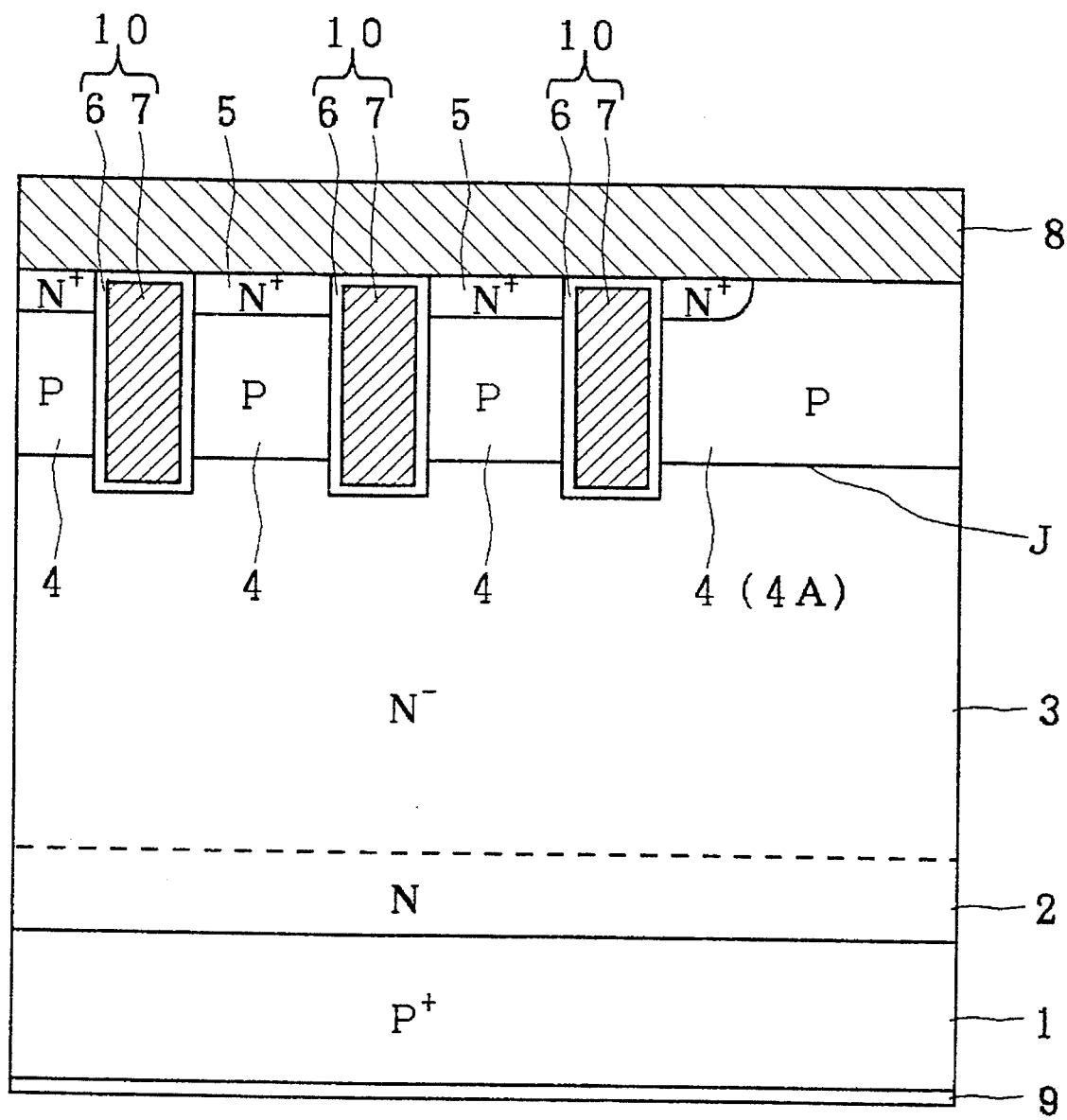
FIG. 25 is a cross-sectional view of a conventional IGBT.

FIG. 24 illustrates a basic structure of the present invention. The present invention is applicable to any semiconductor device structured such that a PN junction formed by a first semiconductor layer 131 of a first conductivity type and a second semiconductor layer 132 of a second conductivity type is separated from each other by isolating layers 133 of trench structure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a first semiconductor layer of a first conductivity type having first and second major surfaces;
    a second semiconductor layer of a second conductivity type formed on said first major surfaces of said first semiconductor layer; and
    a plurality of spaced isolating layers each selectively formed through said second semiconductor layer and having the same depth,
    said plurality of isolating layers separating said second semiconductor layer into a plurality of divided semiconductor regions insulated from each other, said plurality of divided semiconductor regions including an outermost divided semiconductor region located outermost thereof, said outermost divided semiconductor region adjacent to an outermost one of said plurality of isolating layers being deeper than other divided semiconductor regions.

2. The semiconductor device of claim 1, wherein a main breakdown voltage is maintained at an interface between said first and second semiconductor layers.

3. The semiconductor device of claim 2, wherein said outermost divided semiconductor region is equal in depth to said plurality of isolating layers.

4. The semiconductor device of claim 2, wherein a depth of said outermost divided semiconductor region is less than a depth of said plurality of isolating layers.

5. The semiconductor device of claim 4, comprising said outermost divided semiconductor region being in contact with an outermost one of said plurality of isolating layers.

6. The semiconductor device of claim 2, wherein a depth of said outermost divided semiconductor region is more than a depth of said plurality of isolating layers.

7. The semiconductor device of claim 6, comprising said outermost divided semiconductor region being in contact with an outermost one of said plurality of isolating layers.

8. The semiconductor device of claim 3, wherein each of said plurality of isolating layers includes:
    a control electrode region; and
    an insulating film formed around said control electrode region for covering the same,
    said semiconductor device further comprising:
        a first semiconductor region of said first conductivity type formed in a surface of each of said plurality of divided semiconductor regions;
        a third semiconductor layer of said second conductivity type formed on said second major surface of said first semiconductor layer;
        a first electrode formed on said first semiconductor regions and said divided semiconductor regions; and
        a second electrode formed on said third semiconductor layer.

9. The semiconductor device of claim 3, wherein each of said plurality of isolating layers includes:
    a control electrode region; and
    an insulating film formed around said control electrode layer for covering the same,
    said semiconductor device further comprising:
        a first semiconductor region of said first conductivity type formed in a surface of each of said plurality of divided semiconductor regions;
        a third semiconductor layer of said first conductivity type formed on said second major surface of said first semiconductor layer, said third semiconductor layer being higher in impurity concentration then said first semiconductor layer;
        a first electrode formed on said first semiconductor regions and said divided semiconductor regions; and
        a second electrode formed on said third semiconductor layer.

10. The semiconductor device of claim 8, further comprising:
    a second semiconductor region of said second conductivity type formed in said first major surface of said first semiconductor layer in a region external to said outermost divided semiconductor region, said second semiconductor region being equal in depth to said outermost divided semiconductor region.

11. The semiconductor device of claim 10, wherein said first conductivity type is an N type and said second conductivity type is a P type.

12. The semiconductor device of claim 1, comprising said outermost divided semiconductor region being in contact with an outermost one of said plurality of isolating layers.

13. A semiconductor device comprising:
    a first semiconductor layer of a first conductivity type having first and second major surfaces;
    a second semiconductor layer of a second conductivity type formed on said first major surface of said first semiconductor layer; and
    a plurality of spaced isolating layers having the same depth and including a predetermined outermost isolating layer, said isolating layers being selectively formed such that said predetermined outermost isolating layer does not extend through said second semiconductor layer and other isolating layers extend through said second semiconducting layer, said plurality of isolating layers except said predetermined outermost isolating layer separating said second semiconductor layer into a plurality of divided semiconductor regions insulated from each other, said plurality of divided semiconductor regions including an outermost divided semiconductor region being formed to entirely cover said predetermined outermost isolating layer.

14. The semiconductor device of claim 13, further comprising:
   a second semiconductor region of said second conductivity type formed in said first major surface of said first semiconductor layer in a region external to said outermost divided semiconductor region, said second semiconductor region being equal in depth to said outermost divided semiconductor region.

15. A semiconductor device comprising:
   a first semiconductor layer of a first conductivity type having first and second major surfaces;
   a second semiconductor layer of a second conductivity type formed on said first major surface of said first semiconductor layer; and
   a plurality of spaced isolating layers each selectively formed through said second semiconductor layer and having the same depth, said plurality of isolating layers being spaced a first distance apart from each other and separating said second semiconductor layer into a plurality of divided semiconductor regions insulated from each other,
   said plurality of divided semiconductor regions including an outermost divided semiconductor region located outermost thereof, said plurality of isolating layers including an outermost isolating layer adjacent to said outermost divided semiconductor region, said outermost divided semiconductor region including a first region extending outwardly from a position spaced a second distance apart from said outermost isolating layer, said second distance being shorter than said first distance, said first region of said outermost divided semiconductor region being deeper than other divided semiconductor regions.

16. The semiconductor device of claim 15, wherein
   the other divided semiconductor regions have the same depth.

17. The semiconductor device of claim 16, wherein
   said outermost divided semiconductor region further includes a second region extending inwardly from the position spaced said second distance apart from said outermost isolating layer, and said first region of said outermost divided semiconductor region is in depth equal to said isolating layers, and said second region of said outermost divided semiconductor region is equal in depth to the other divided semiconductor regions.

18. The semiconductor device of claim 17, further comprising:
   a second semiconductor region of said second conductivity type formed in said first major surface of said first semiconductor layer in a region external to said outermost divided semiconductor region, said second semiconductor region being equal in depth to said first region of said outermost divided semiconductor region.

* * * * *